United States Patent
Rebstock

(10) Patent No.: US 11,443,962 B2
(45) Date of Patent: Sep. 13, 2022

(54) INTEGRATED HANDLING SYSTEM FOR SEMICONDUCTOR ARTICLES

(75) Inventor: Lutz Rebstock, Gaienhofen (DE)

(73) Assignee: Brooks Automation US, LLC, Chelmsford, MA (US)

( * ) Notice: Subject to any disclaimer, the term of this patent is extended or adjusted under 35 U.S.C. 154(b) by 0 days.

(21) Appl. No.: 12/817,310

(22) Filed: Jun. 17, 2010

(65) Prior Publication Data
US 2010/0319733 A1   Dec. 23, 2010

Related U.S. Application Data

(60) Provisional application No. 61/218,067, filed on Jun. 17, 2009.

(51) Int. Cl.
| | | |
|---|---|---|
| *H01L 21/67* | (2006.01) | |
| *B08B 5/02* | (2006.01) | |
| *B08B 9/093* | (2006.01) | |
| *B08B 3/02* | (2006.01) | |
| *B08B 9/08* | (2006.01) | |

(52) U.S. Cl.
CPC .......... *H01L 21/67034* (2013.01); *B08B 3/02* (2013.01); *B08B 5/02* (2013.01); *B08B 9/0826* (2013.01); *B08B 9/093* (2013.01); *H01L 21/67028* (2013.01); *H01L 21/67051* (2013.01); *H01L 21/67115* (2013.01)

(58) Field of Classification Search
CPC ......... H01L 21/67034; H01L 21/67028; H01L 21/67051; H01L 21/67115
USPC ......... 134/18, 21, 26, 32, 42, 137, 140, 144, 134/151, 153, 157
See application file for complete search history.

(56) References Cited

U.S. PATENT DOCUMENTS

| | | | |
|---|---|---|---|
| 6,267,123 B1 * | 7/2001 | Yoshikawa et al. | ............ 134/62 |
| 6,478,035 B1 | 11/2002 | Niuya et al. | |
| 8,591,664 B2 | 11/2013 | Rebstock | |
| | (Continued) | | |

FOREIGN PATENT DOCUMENTS

| | | |
|---|---|---|
| AU | 2003284041 | 6/2004 |
| CN | 1802222 | 7/2006 |
| | (Continued) | |

OTHER PUBLICATIONS

Machine translation of JP2005-109523A (pp. 1-19).*

(Continued)

*Primary Examiner* — Sharidan Carrillo
(74) *Attorney, Agent, or Firm* — Perman & Green, LLP; Colin C. Durham

(57) ABSTRACT

Methods and apparatuses for integrated cleaning of objects comprising a sequence of wet cleaning and vacuum drying in a same process chamber. The present integrated cleaning process can eliminate moving parts, improving the system reliability. Vacuum decontamination can be included for degassing and decontaminating the cleaned objects. In an embodiment, a cleaner system combines various movements into an integrated movement to be handled by a robot, for example, to improve the throughput. For example, an integrated robot movement comprising picking up a closed container from the input load port, moving both the lid and body together, and then depositing the body and lid separately into the appropriate positions in the cleaner to be cleaned.

20 Claims, 22 Drawing Sheets

(56) References Cited

U.S. PATENT DOCUMENTS

| | | |
|---|---|---|
| 2004/0084066 A1 | 5/2004 | Dolechek et al. |
| 2005/0224103 A1 | 10/2005 | Dolechek |
| 2006/0281326 A1 | 12/2006 | Ose et al. |
| 2009/0082895 A1* | 3/2009 | Barker ............ H01L 21/67742 |
| | | 700/112 |
| 2010/0282272 A1 | 11/2010 | Godot et al. |
| 2010/0319730 A1* | 12/2010 | Rebstock ...................... 134/19 |

FOREIGN PATENT DOCUMENTS

| | | |
|---|---|---|
| CN | 101821573 | 9/2010 |
| EP | 2179236 | 4/2010 |
| FR | 2929046 | 2/2009 |
| JP | 04354128 | 12/1992 |
| JP | 0745574 | 2/1995 |
| JP | 2001110733 | 4/2001 |
| JP | 2003266252 | 9/2003 |
| JP | 2004335838 | 11/2004 |
| JP | 2005109523 | 4/2005 |
| WO | 2004042789 | 5/2004 |
| WO | 2004093147 | 10/2004 |
| WO | 2004093147 | 3/2005 |
| WO | 2009021941 | 2/2009 |

OTHER PUBLICATIONS

Merriam Webster Dictionary, pp. 1-9, definition of disassemble; Sep. 27, 2018 (Year: 2018).*

PCT preliminary report on patentability—PCT/IB2010/052745—dated Jun. 17, 2010.

* cited by examiner

A

B

C

D

INTEGRATED HANDLING SYSTEM FOR SEMICONDUCTOR ARTICLES

This application claims priority from U.S. Provisional Patent Application Ser. No. 61/218,067, filed on Jun. 17, 2009, entitled "Integrated cleaner and drier system"; which is incorporated herein by reference.

This invention relates to apparatuses and methods for cleaning workpieces or workpiece containers, such as wafer carriers used in the semiconductor fabrication industry.

BACKGROUND

The production of semiconductor components requires cleanliness, such as control of particles, impurities, or foreign matter. The presence of these particulates can affect the yield of good devices within the processed wafers. Thus the transport of these wafers is typically carried out in special transport containers, such as cassettes, carriers or trays, as well as closable or sealable containers or boxes, including Front Opening Unified Pod [FOUP], Front-Opening Shipping Box [FOSB], Standard Mechanical Interface [SMIF] pods or boxes. The FOUP typically possesses comblike guidance at two facing long sides for supporting the wafers, and can be closed with a removable cover. Without the cover the FOUP is a hollow container having a pot-like basic form with a rectangular surface area.

The FOUP needs to be cleaned occasionally to maintain the standard of cleanliness required in processing semiconductor wafers. The cleaning process can be performed in special cleaning and drying equipment. With increasing requirements for cleanliness, the number of cleaning cycles in the modern semiconductor factory rises. There are circumstances when it is desirable to clean a FOUP after each individual use in order to prevent, for example, cross contamination from one wafer load to the next.

Thus it is desirable to shorten the time needed for a complete cleaning of the FOUPs. Furthermore, it is also desirable to keep cleaning consumables as small as possible, especially in view of the increased cleaning cycles. On the other hand, the cleaning must be very thorough in order to fulfill the cleanliness requirements of modern semiconductor factories.

SUMMARY

The present invention discloses methods and apparatuses for integrated cleaning of objects, such as semiconductor workpiece containers. In an embodiment, the present invention discloses a sequence of wet cleaning and vacuum drying in the same process chamber. The present integrated cleaning process can eliminate moving parts, improving the system reliability. The present vacuum drying process can eliminate drying gas, reducing operating consumables. Other elements can be included, such as an IR heating mechanism to assist the drying process and to prevent liquid freezing, and a humidity sensor to monitor the drying process and end point.

In an embodiment, the present invention discloses an integrated cleaning process and system, providing effective object cleaning with minimum liquid residue. The cleaning process can comprise cleaning chemical and deionized water, delivered by ultrasonic, aerosol or high pressure spray to remove impurities and contaminate particles, such as metal contamination. The drying process can comprise vacuum drying with heater such as IR lamp heater, drying the cleaned objected with no moving parts. In an embodiment, the wet cleaning and vacuum drying processes are sequentially performed in the same cleaning chamber. Vacuum pumping can also be performed during the wet cleaning process to remove liquid vapor during the cleaning process.

In an aspect, the present cleaning provides minimum liquid residue to assist in vacuum drying. For example, the amount of cleaning and rinsing liquid can be rationed, such as spraying with fine droplets and aerosol gas bubbles. Carrier gas can be mixed with liquid delivery. Hot gas and hot liquid can be utilized. Fast evaporating liquid can be used, such as alcohol with low boiling temperature and high vapor pressure. The liquid can be removed by good drainage with no liquid retention and no liquid dead spots. The liquid vapor can be removed by exhaust and low chamber pressure, for example, by maintaining a vacuum pressure inside the cleaning chamber during the liquid cleaning cycle. Cyclic cleaning processes can be performed for effective cleaning. Hot gas purging can be provided to reduce liquid residue on the object, facilitating the subsequent drying process. Simulations are performed to optimize the cleaning processes, such as optimizing the locations and flows of the cleaning nozzles. For example, the cleaning solutions can be focused near the cleaning surfaces, and located at corners of objects to be cleaned. Different cleaning processes can be used on the inside and outside of the containers. For example, inside cleaning can be more focused on metal decontamination and degassing of volatile organic components. In addition, inside cleaning can be performed more thoroughly than outside cleaning, reducing liquid cleaner consumption.

In an embodiment, the present invention discloses an effective vacuum drying process with high throughput. The present vacuum drying offers no moving parts, thus can improve system reliability together with a vacuum ambient for assisting fast evaporation of liquid residue after cleaning. The cleaning chamber can be designed to provide configurations with effective pumping and high pumping conductance. There are minimum obstacles in pumping paths to reduce vapor condensation. The present vacuum drying can further comprise a heating mechanism, such as IR heaters, to assist in liquid residue evaporation and to prevent liquid freezing. The distribution of IR heater can be arranged to provide uniform thermal energy to the object to be cleaned, enabling homogeneity of liquid evaporation and evaporation rate. Chamber wall heater can also be included, for example, to minimize condensation.

In an embodiment, the cleaning process and system can comprise a vacuum decontamination and/or degassing. The decontamination process can be performed in the integrated cleaner/dryer chamber, or in a separate vacuum chamber. The decontamination process can be performed in addition, and after, the cleaning and drying process, or can be performed separately without any cleaning. For example, the decontamination process can provide plastic aging, such as outgassing, for new containers.

In an embodiment, the present invention discloses apparatuses and methods for transferring substrate containers, for example, in a container processing system such as a container cleaner. In an embodiment, the present invention combines various container movements into an integrated movement to be handled by a robot. For example, an integrated robot movement comprising picking up a closed container, either from an input load port or from an intermediate station within a cleaner system, moving both the lid and body together, and then depositing the body and lid separately into appropriate positions in the cleaner to be cleaned. The integrated movement can also comprise unlocking the lid and/or separating the lid from the body during the transfer from the load port to the cleaning positions. The integrated movement can also comprise other actions, such as rotating the closed container for ease of unlocking or separating the lid.

In an embodiment, the present invention comprises an integrated transfer movement of substrate container, comprising transferring the lid and body of a container together and separately placing them at the appropriate cleaning stations. The mechanism can also be reversed, separately picking the lid and body after cleaning, assembling and locking them in place during transfer to an output load port. A robot can pick up/deliver a closed container from/to a load port, thus eliminating additional separating/assembly stations.

In an embodiment, the integrated transfer movement comprises an in-situ unlocking and/or locking mechanism to unlock/lock the lid from/to the body of a container during container movements. The unlocking/locking mechanism can be on the robot or can be positioned in the vicinity of the robot. The integrated transfer movement can also comprise additional movement to accommodate the unlocking/lock mechanism. For example, the integrated transfer movement can rotate or tilt the container to have the lid at the bottom before unlocking, thus providing stability for the unlocked container during movement.

In an embodiment, the present invention comprises an integrated transfer robot for substrate container, comprising one or more grippers for holding the lid and body of a container, and optional unlock/lock mechanism for unlock/locking the lid from/to the body. The integrated robot can be used in a container cleaner, for example, an integrated cleaner with cleaning and drying capabilities in the same chamber.

DETAILED DESCRIPTION OF THE PREFERRED EMBODIMENTS

The present invention is directed to cleaning articles, especially semiconductor articles such as cassettes, FOUPs, holders, etc. In an embodiment, the present invention provides a cleaning process for objects having multiple portions assembled together, such as a container (e.g., FOUP or FOSB) having a separate body and a separate lid. The body and lid are assembled, e.g., locked together during transport and storage of semiconductor substrates, and are disassembled, e.g., separated into separate portions, during cleaning. The container is typically provided to the cleaner in locked state, and is unlocked, cleaned and re-locked by the cleaner. In a configuration, the lid is vertically positioned in the cleaning chamber to aid in draining the cleaning liquid. The container body is positioned with the opening facing the bottom of the cleaning chamber, where the pumping port of the vacuum pump is located. The operation of the cleaning chamber can be manually operated, though it is preferably operated automatically by an electronic controller or a computer.

In an embodiment, the present improved cleaning process comprises an integrated sequence of liquid cleaning and vacuum drying in a same process chamber. The present liquid cleaning can conserve water and cleaning liquid and chemical with less cleaning time, improving cleanliness and particulate removal with a combination of cleaning liquids, surfactant, heat, and agitated or aerosol liquid flow. The present vacuum drying can eliminate moving parts and improve system reliability.

Cleaning methods consist of ways to remove particles and/or contamination such as organic, inorganic metals, native oxide and particulate matters as well as removing water spots. Cleaning is a critical requirement for semiconductor articles such as cassettes, FOUP, FOSB, holders, etc. In critical cleaning, removal of particles in the range of a few microns down to sub-micron levels and reduction of trace contaminants (metals or ions) have become part of the concerns of semiconductor cleaning industry.

In an embodiment, the present invention discloses an integrated cleaning process and system, providing effective object cleaning with minimum liquid residue. In an aspect, the minimal liquid residue can assist in the subsequent drying process, such as vacuum drying. In an aspect, the article to be cleaned is positioned with minimum liquid traps, such as on horizontal surfaces. In addition, at potential trap locations, gas nozzles can be located to blow away any trapped liquid to help in minimizing liquid residue and assisting the drying process. Gas nozzles preferably provide nitrogen or filtered air, but can also provide liquid or aerated liquid. In an aspect, gas nozzles can perform cleaning action, and liquid nozzles can remove trapped liquid.

Figure 1A:
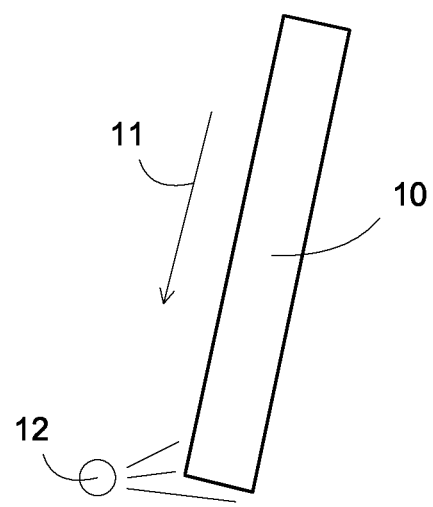
FIGS. 1A-1B illustrate exemplary configurations of an article to be cleaned, positioned so that the liquid can run down by gravity, together with gas nozzles to assist in removing liquid residue.

FIG. 1A illustrates an exemplary configuration of an article 10 to be cleaned, positioned so that the liquid can run down 11 by gravity. A bottom gas nozzle 12, providing nitrogen, filtered air, liquid or aerated liquid, can be directed toward the bottom of the article to help remove liquid residue trapped by surface tension.

Figure 1B:
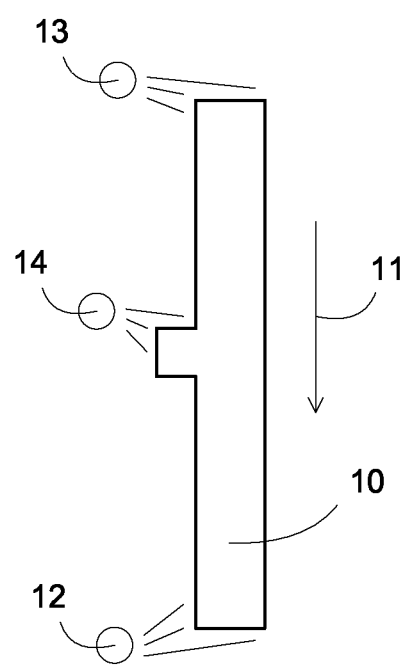

FIG. 1B illustrates another exemplary configuration of an article 10 to be cleaned, together with a plurality of gas nozzles directed toward the article 10 to assist in removing any liquid residue. For example, a bottom gas nozzle 12 can be directed toward the bottom of the article to help remove liquid residue trapped by surface tension. In addition, a top gas nozzle 13 can be directed toward the top surface to help remove liquid residue trapped on a horizontal surface, and another gas nozzle 14 can be directed toward an irregular shape of the article where liquid residue can be trapped.

To clean the article, a plurality of liquid nozzles can be directed toward the article surfaces. The liquid nozzles can deliver mixtures of cleaning liquid, rinsing liquid (such as DI water), and other chemical liquid designed for cleaning and decontaminating the article, such as surfactant or metal removal agent. The amount of liquid can be carefully controlled, such as by spraying with fine droplets and aerosol gas bubbles together with carrier gas (such as nitrogen, air or inert gas). The liquid nozzles can also be configured to deliver gas, such as nitrogen or filtered air, or gas/liquid mixtures. Fast evaporating liquid can be used, such as alcohol with low boiling temperature and high vapor pressure. Hot carrier gas and hot liquid can also be utilized, for example, to assist in fast drying by evaporation. In addition, the chamber and the positioning of the article can be designed so that the liquid can be removed by good drainage with no liquid retention and no liquid dead spots. Further, the liquid vapor can be removed by fast exhaust and low chamber pressure, for example, by purging with dry gas and/or by maintaining a vacuum pressure inside the cleaning chamber during the liquid cleaning cycle.

In an embodiment, the cleaning nozzles (gas or liquid) can be located near the cleaning surfaces, especially at corners. Also, the cleaning process can be more focused on the inside than the outside of the containers, reducing the outside liquid cleaning. The number of nozzles and the locations of the nozzles are designed to simplify system construction and maximize effective cleaning with minimum liquid residues. The configurations of the spray nozzles are designed to effectively distribute the liquid spray onto the article surfaces. In general, the nozzles are located in high positions to spray downward. The nozzles also point toward the corners of the article for effective cleaning. High flow rate is preferred, so the number of nozzles is kept small. If there is no corner, for example, facing the FOUP door, then the nozzles are closely distributed to provide more uniform flow.

Figure 2A:
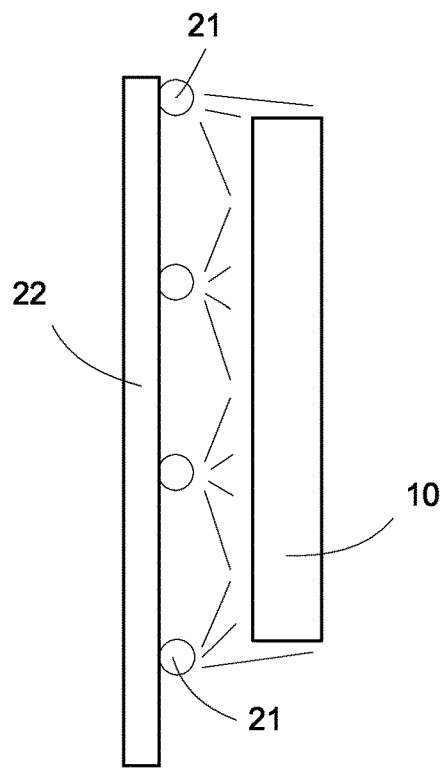
FIGS. 2A-2B illustrate exemplary configurations of liquid nozzles facing the surface of an article to be cleaned.
Figure 2B:
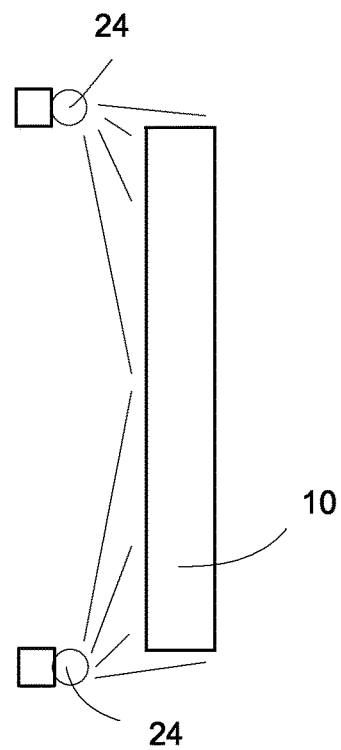

FIG. 2A illustrates an exemplary configuration of liquid nozzles 21 facing the surface 20 of an article 10. In this configuration, the plurality of nozzles 21 is connected by a manifold 22. The manifold 22 can be positioned at various angles, but preferably positioned vertically to minimize liquid residue attached to the manifold through gravity force. The nozzles are designed to overlap the surface 20, providing complete coverage of the surface to ensure complete cleaning. The nozzles can provide a small angle flow, for example, to have adequate cleaning force. The angle of impact can be perpendicular to the surface for greater force, or can be along the surface for higher surface coverage. In an aspect, the article to be cleaned is a semiconductor container, thus contamination tends to be small particulates or metal contamination, and the present invention discloses cleaning nozzles having medium pressure and low angle of impact of cleaning for higher coverage area. FIG. 2B illustrates another exemplary configuration of two liquid nozzles 24 located at the ends of the article 10. The nozzles are located at corners of the article 10, and configured to cover the whole surface.

Figure 3A:
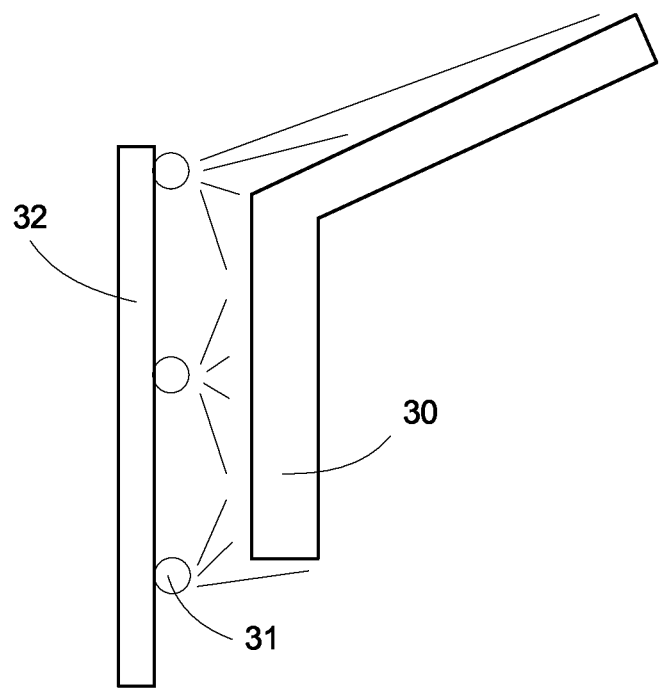
FIGS. 3A-3B illustrate exemplary configurations of liquid nozzles facing multiple surfaces of an article to be cleaned.
Figure 3B:
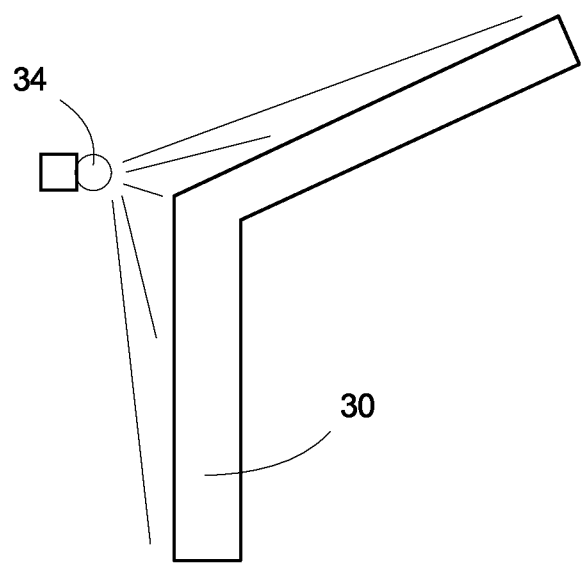

FIG. 3A illustrates an exemplary configuration of liquid nozzles 31, connected by a manifold 32, facing multiple surfaces of an article 20. A corner nozzle 31A is configured to cover the top surface, together with a portion of the side surface. Other nozzles are designed to cover sections of the side surface. FIG. 3B illustrates another exemplary configuration of a liquid nozzle 34 located at a corner of the article 20 and configured to cover the whole surface of the article.

Figure 4:
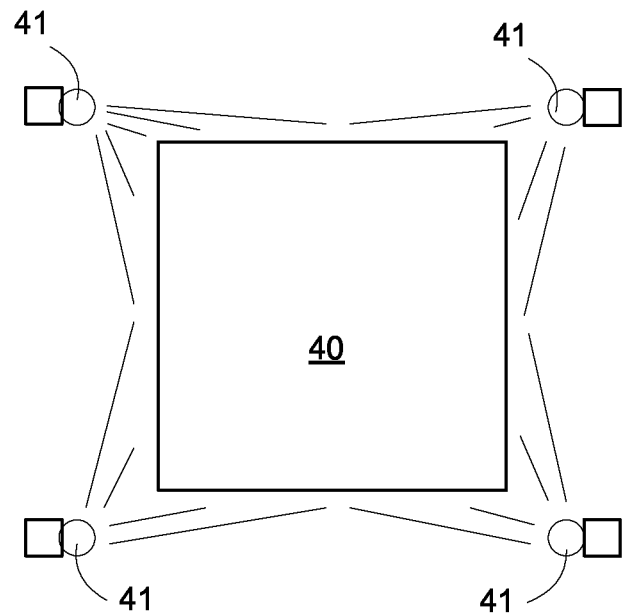
FIG. 4 illustrates an exemplary configuration of liquid nozzles surrounding a FOUP.

FIG. 4 illustrates an exemplary configuration of liquid nozzles 41 surrounding a FOUP 40. The nozzles are located at the corners and arranged to cover the whole surface of the FOUP. This configuration can be a top view or a side view. In a top/side view configuration, the nozzles 41 can be embedded within vertical/horizontal manifolds (not shown), respectively, with each manifold having a plurality of nozzles. The nozzles 41 typically have a small angle of coverage, since they are positioned outside the article and designed to clean the outer surfaces.

For inside cleaning, the nozzles are preferably positioned within the cavity of the article, thus providing up to sphere coverage ($4\pi$ solid angle). In a preferred embodiment, the opening of the article is facing downward to minimize trapped liquid. The nozzles are preferably facing upward toward the inside of the article. The inside nozzle manifolds are arranged vertically, entering the opening with a sphere nozzle at the top.

Figure 5:
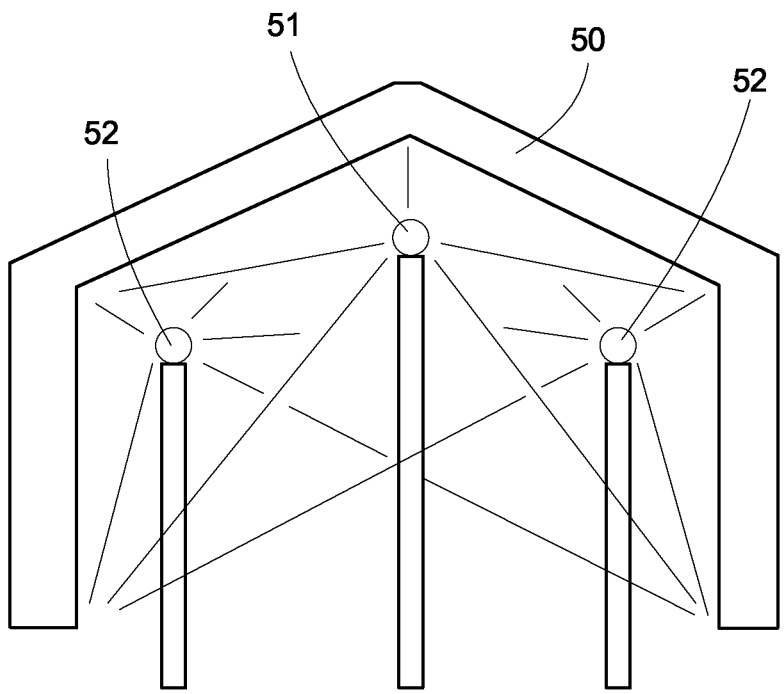
FIG. 5 illustrates an exemplary configuration of inside nozzles within an article to be cleaned.

FIG. 5 illustrates an exemplary configuration of inside nozzles within an article 50. A center nozzle 51, which is preferably a spherical nozzle, is positioned near the top inside surface, spraying liquid to the top surface together with the surrounding surfaces. The liquid can run down from the top surface, further cleaning the surrounding surfaces after cleaning the top surface. A plurality of corner nozzles 52, also preferably spherical nozzles, are directed to the inner corners of the inside surfaces for focusing on the surface corners.

In a typical cleaning process, cleaning liquid, such as cleaning solution, is sprayed onto the article, such as the FOUP container and door. Additives, such as surfactant, detergent, or contamination/metal removal agents may be added into the water or other liquid, for example, by aspiration or pumping. The contamination/metal removal agent can be a metal removal agent such as a chelating agent. A high alkaline detergent may be used in place of the surfactant. UV light can be added, for example, to aid removal of contamination. After completing cleaning and/or contamination removal, the article is then rinsed by spraying with a rinsing liquid, such as DI water. Cyclic cleaning/rinsing processes can be performed for effective cleaning. The cleaning liquid can be collected for recycling.

In an embodiment, the cleaning process is focused on the surfaces of the article to be cleaned, and thus minimizing the amount of liquid hitting the chamber surfaces. The nozzles are preferably pointing toward the surfaces of the article, with the angle of spray carefully controlled to cover the surfaces to be cleaned, and with minimum liquid escaped to the chamber surfaces. Minimizing the amount of liquid on the chamber surfaces can improve the subsequent drying process.

In an embodiment, the cleaning process provides small liquid droplets to aid in the subsequent drying process. In addition, purged gas or liquid spray can be provided to break droplets into even smaller ones. In the areas where the liquid is consolidated, for example, at the bottom of the surfaces, gas or liquid spray can be provided to break the large, consolidated liquid into small droplets, such as by blowing the liquid away.

In an embodiment, the cleaning environment is dry air, inert or non-reactive gas. For example, after loading the article, the air within the process chamber can be evacuated and replaced with a process gas, such as inert (e.g., argon) or non-reactive gas (e.g., nitrogen). In an aspect, the chamber is purged during liquid cleaning. In another aspect, the chamber is sealed and maintained at sub-atmospheric pressure, for example, to aid in removing liquid vapor within the process chamber ambient. The reduced pressure can be in the range of tens of Torr, Torr, or even milliTorr. In an aspect, the liquid can be heated to increase the volatility, adding in the ease of liquid residue removal. Heated liquid can be recycled to reduce energy cost. In addition, the article and the process chamber can also be heated, for example, by IR or UV lamps.

After cleaning, the container can be rinsed. Optional gas purge, such as hot air flow, can be utilized to further reduce the amount of liquid remaining on the container surfaces. The nozzles can also be configured to provide liquid for cleaning, liquid for rinsing, and gas for pushing liquid away from the container surface.

In an embodiment, the present invention discloses an optimum configuration for container cleaning, including cleaning the inside and outside of the container body, together with cleaning the container lid, separated from the container body and positioned near the container body within a cleaning chamber.

FIGS. 6A-6B and 7A-7B illustrate a side view and a top view of a cleaning chamber according to an embodiment of the present invention. A container comprises a container body 61 and a container lid 62 disposed in a cleaning chamber 60. The body 61 and the lid 62 are disengaged and positioned at separate locations in the cleaning chamber 60. In addition, the body and the lid are positioned to prevent excessive liquid residue remaining on the surfaces of the container body and lid. In an embodiment, the lid is positioned vertically to allow the liquid to run down by gravity to a drainage (not shown), located at the bottom of the cleaning chamber 60. Similarly, the body is also positioned vertically, with the opening located at the bottom, to allow inner liquid nozzles 63, 64 to deliver cleaner liquid.

In an embodiment, liquid nozzles are positioned inside (63 and 64) and outside (71, 72, 73, and 74) of the body cavity for cleaning the inside and outside of the container, respectively. Various nozzle configurations have been tested to optimize the distribution of liquid velocity, the coverage and the residence time of the liquid on the container surfaces, and the stress on the container.

Figure 6A:
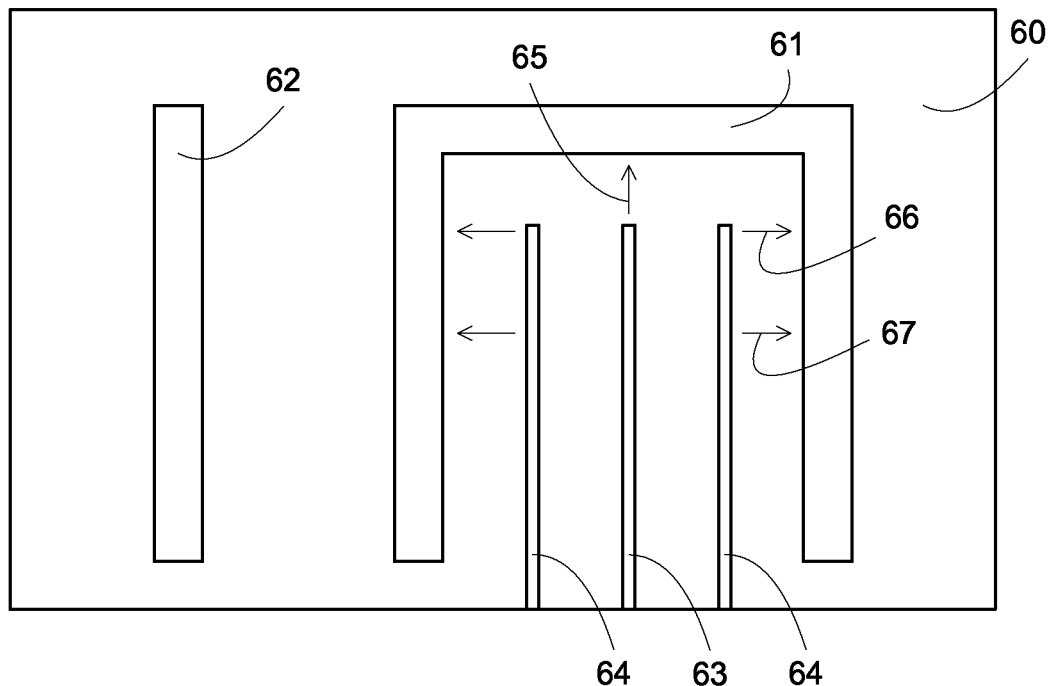
FIGS. 6A and 6B illustrate selected configurations of inside nozzles delivering liquid flows to the inside of a container body according to an embodiment of the present invention.
Figure 6B:
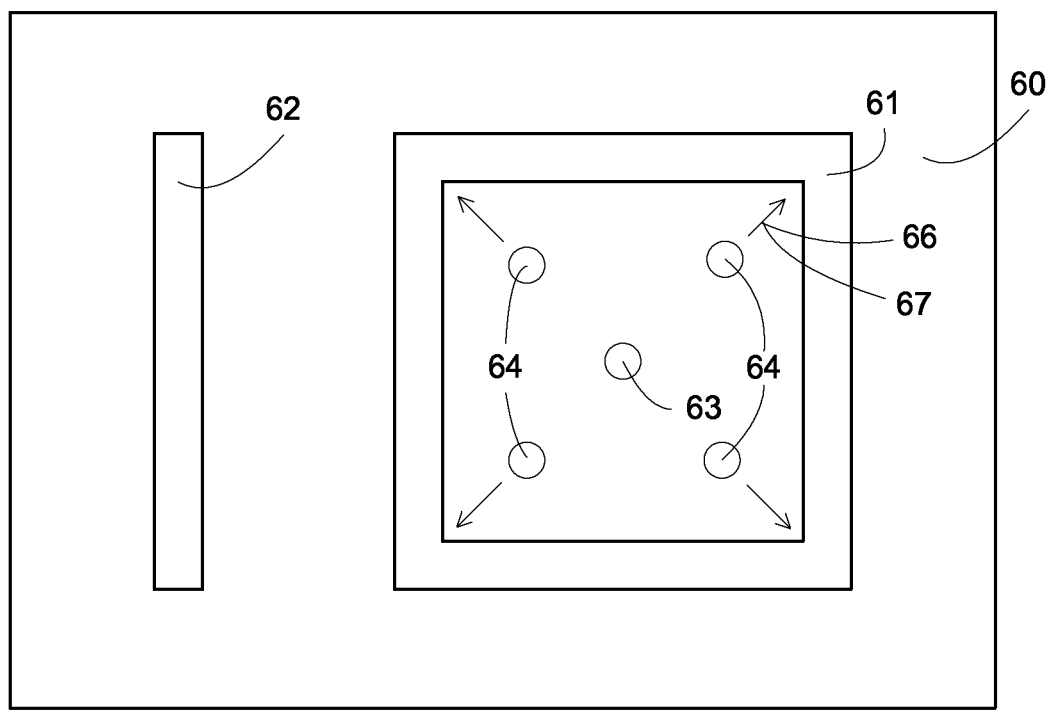

FIGS. 6A and 6B illustrate selected configurations of inside nozzles 63 and 64, delivering liquid flows 65, 66 or 67. In one configuration, nozzle 65 is located in the middle of the body cavity, delivering liquid flow 65 straight up toward the top of the contain body. In another configuration, nozzles 64 are located at corners of the body cavity, delivering liquid flows toward the corners of the container body. As shown, the nozzles 64 are located at about halfway between the center nozzle 63 and the corners. The nozzles 64 can deliver liquid flows at high position 66 or at a middle position 67. In addition, high flow and flow are also simulated.

In general, the motion of the flows does not vary much with the flow rate, with the residence time strongly increases with low flow rate. The distribution of the flow velocity is more uniform with higher flow rate. The center flow 65 does not provide efficient coverage of the container surface. In addition, the middle position flows 67 provide better flow uniformity than the high position flows 66. Thus simulation results show that an optimized configuration for inside container cleaning comprises 4 nozzles placed at middle height, turning toward the corners of the container, and with as high flow rate as possible.

Figure 7A:
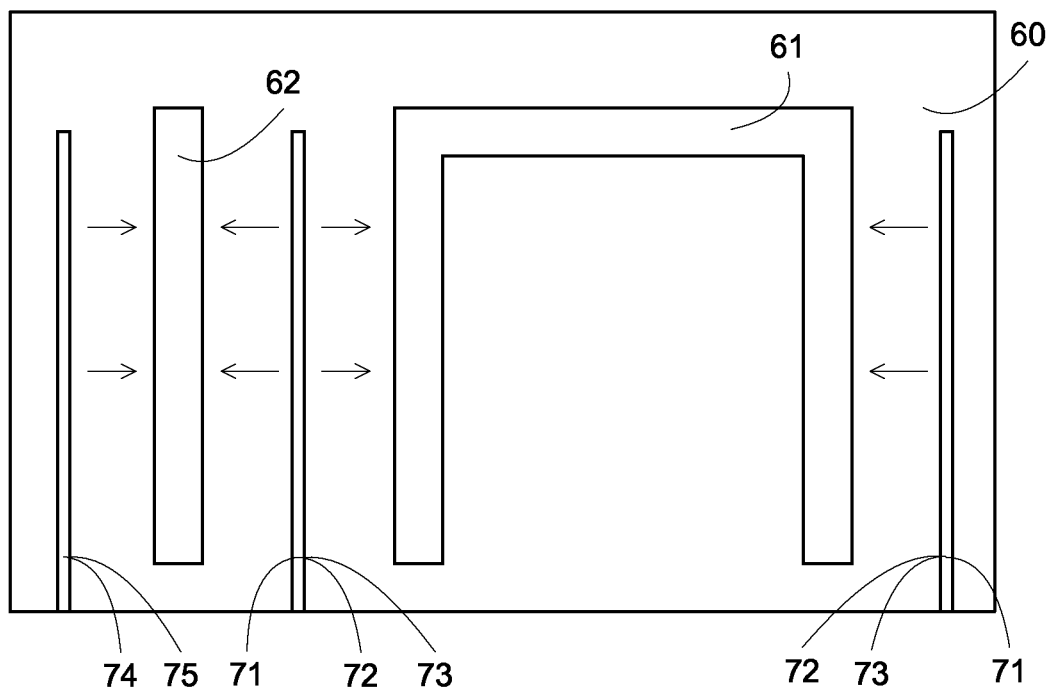
FIGS. 7A and 7B illustrate selected configurations of outside nozzles delivering liquid flows to the outer surfaces of the container body and lid.
Figure 7B:
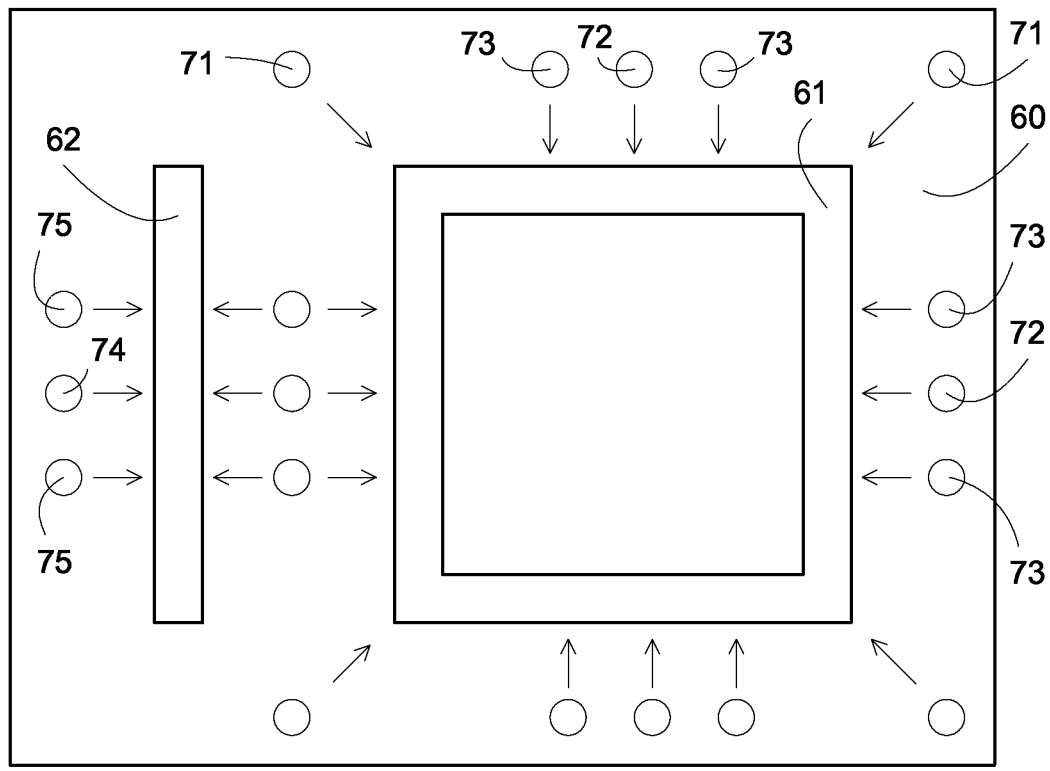

FIGS. 7A and 7B illustrate selected configurations of outside nozzles 71, 72, and 63, delivering liquid flows to the outer surfaces of the container body and lid. In one configuration, nozzles 71 are located at 4 corners of the container, delivering liquid flow toward the outer corners. In another configuration, nozzles 72 and 74 are located at centers of the container surfaces, delivering liquid flows toward the middle of the container body and the container lid. A same delivery pipe can deliver flow toward both body and lid surfaces, for example, by front and back nozzles. In another configuration, nozzles 73 and 75 are distributed toward each surface of the container, for example, two nozzles for each surface. Further, the nozzles can deliver liquid flows at high position 76 or at a low position 77. In addition, high flow and flow are also simulated.

With center nozzles 72, the corners may not be flushed. Better homogeneity can be achieved with higher position flows, due to the contribution of the inside cleaning flows. Distributed flows 73 provide better uniformity, but with lower efficiency due to high usage of liquid consumption. Thus simulation results show that an optimized configuration for outside container cleaning comprises 4 corner nozzles 71 placed at high positions, turning toward the corners of the container, two nozzles 75 each toward the surfaces of the lid, and with as high flow rate as possible.

In an embodiment, the present invention discloses a chamber for cleaning containers, with an optimized configuration of nozzle positions for best surface cleaning. In addition, the configuration offers minimum liquid residue, helping in subsequent vacuum drying process.

In an embodiment, the present invention discloses an effective vacuum drying for the article cleaning process. The present vacuum drying offers no moving parts, improving system reliability. The present vacuum drying can be further improved by a minimum liquid residue resulting from the cleaning process, together with a purging or a vacuum ambient during liquid cleaning phases to assist in removing liquid vapor during the liquid cleaning. The present drying process can also be improved by a cleaning process with small liquid droplets, and by a cleaning configuration that results in minimum liquid at the chamber surfaces.

The cleaning chamber can be designed to provide configurations with effective pumping and high pumping conductance. There are minimum obstacles in the pumping paths to reduce vapor condensation. There are minimum dead spaces in the pumping paths to reduce liquid vapor trapping. For example, the pumping port is located in the bottom of the chamber, since the opening of the article also faces the chamber bottom for better liquid drainage. Dry gas nozzles can be provided at condensation or liquid consolidation areas to prevent large liquid droplets or to reduce droplet surface tension.

The present vacuum drying can further comprise a heating mechanism, such as IR heaters, to assist in liquid residue evaporation and to prevent liquid freezing. Chamber wall heater or heaters can also be included, for example, to minimize condensation and assist in removing liquid residues. IR heaters can be positioned outside and inside the article, facing the article surfaces to be cleaned. The IR heaters are preferably distributed at the center of the article to provide uniform heating. The heating mechanism can provide a constant temperature to the chamber or the article. The heating can be set at a minimum, for example, to provide enough thermal energy for evaporation, and maintaining a room temperature. The heating can be added to increase the evaporation process, for example, at below 100 C or below 60 C. For high temperature, thermal insulation can be provided for safety purpose. In addition, the pumping manifolds and the vacuum pump can be heated to prevent condensation and to assist in the drying process.

In an embodiment, the IR heaters deliver uniform thermal energy to the container surfaces. For containers made of plastic materials, uniform temperature distribution is desirable to prevent hot spots (which can lead to container damage) and to prevent cold spots (which can lead to inefficient drying). Thus in an embodiment, the present system discloses IR heaters configurations that provide heating uniformity to the container inner and outer surfaces.

FIGS. 8A-8B and 9A-9B illustrate a side view and a top view of a cleaning chamber with inner and outer IR heaters according to an embodiment of the present invention. In an embodiment, IR heaters are positioned inside (47, 48 and 49) and outside (56, 57, 58 and 59) of the body cavity for heating the inside and outside surfaces of the container, respectively. Various heater configurations have been tested to optimize the distribution of thermal energy, the temperature uniformity and the efficiency of the heating process.

Figure 8A:
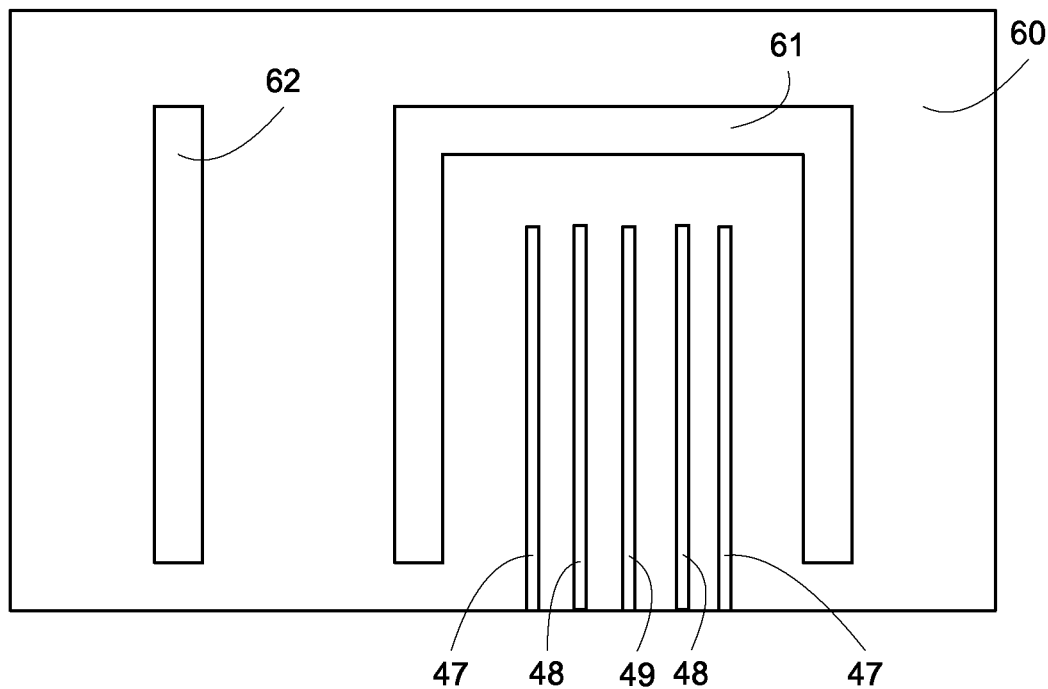
FIGS. 8A and 8B illustrate selected configurations of inside IR heaters delivering thermal energy to the inside of a container body according to an embodiment of the present invention.
Figure 8B:
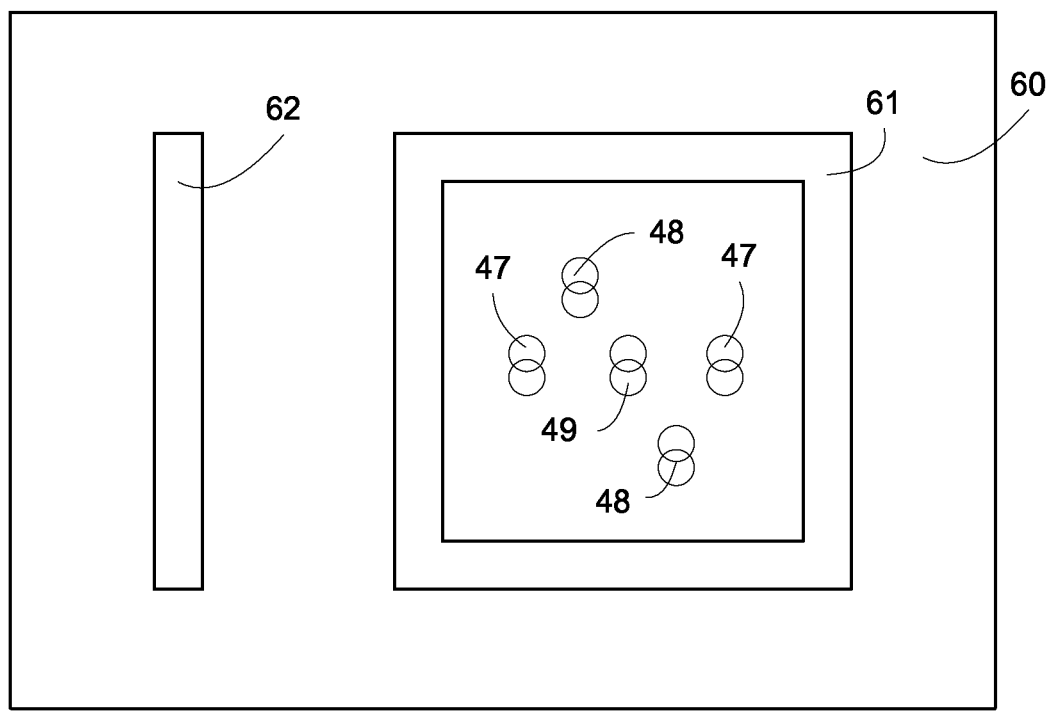

FIGS. 8A and 8B illustrate selected configurations of inside heaters 47, 48 and 49. In one configuration, heater 49 is located in a middle of the body cavity, heating all inner surfaces of the contain body. In another configuration, heaters 48 are located facing the surfaces of the body cavity. In yet another configuration, heaters 47 are located near the corners of the body cavity. The IR heaters chosen are double lamps, giving a broader surface energy. In addition, the orientations of the doubled lamps are also studied.

Simulation results show that an optimized configuration for inside container heating comprises 2 or 4 heaters 48 provides better thermal uniformity with less cold or hot spots.

Figure 9A:
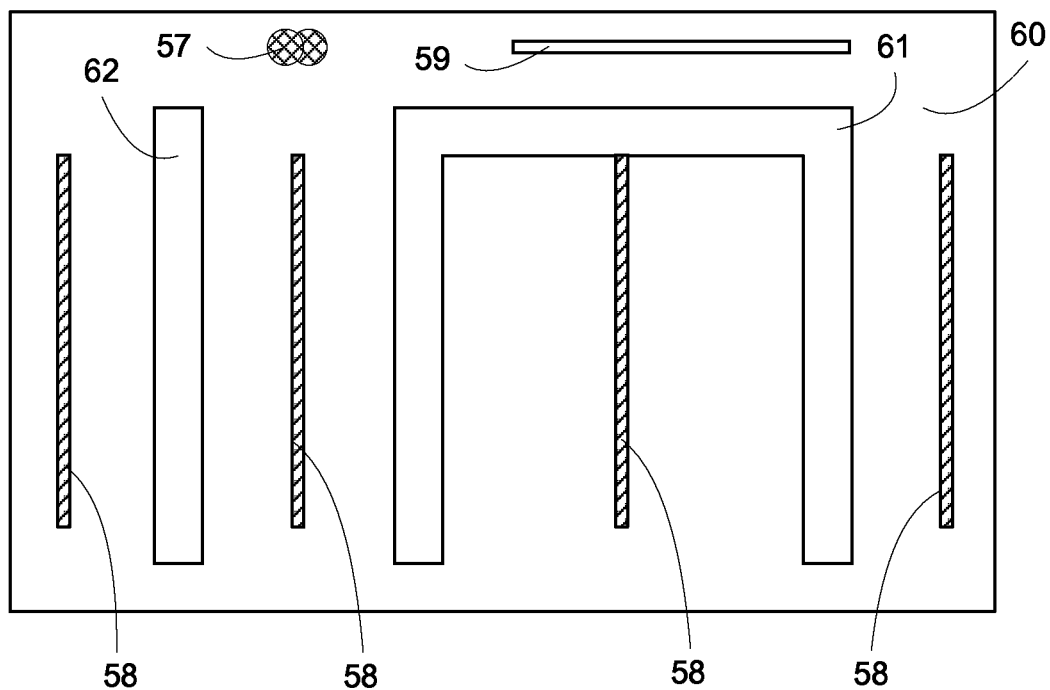
FIGS. 9A and 9B illustrate a configuration of outside IR heaters delivering thermal energy to the outer surfaces of the container body and lid.
Figure 9B:
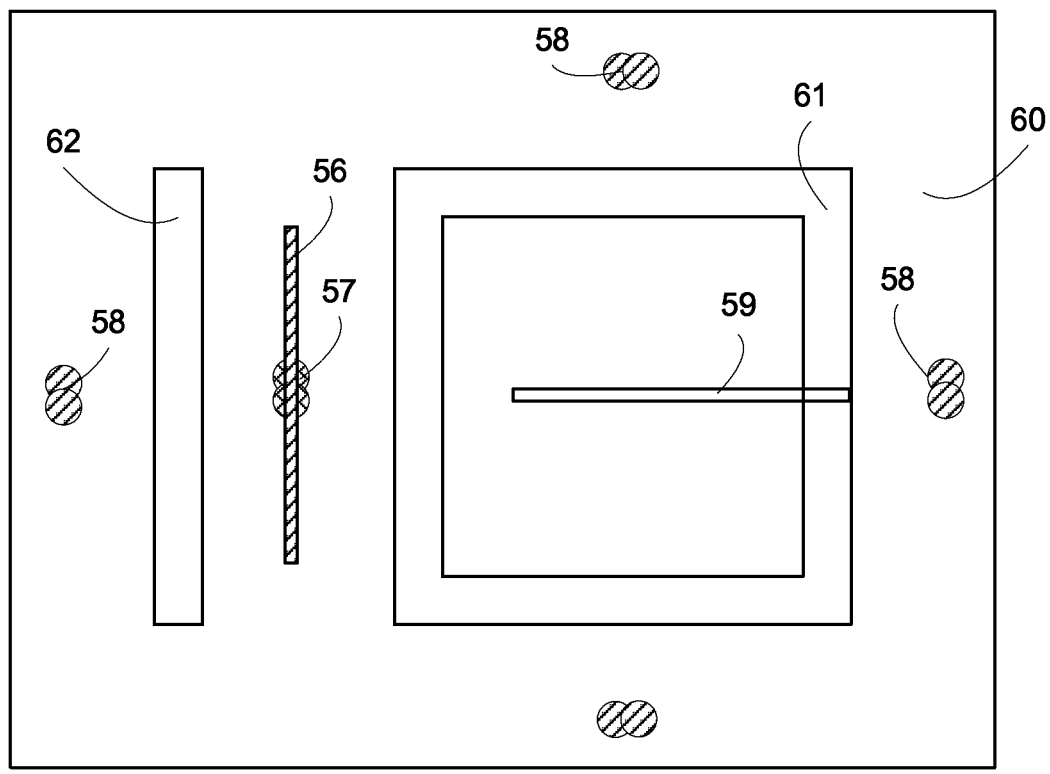

FIGS. 9A and 9B illustrate a selected configuration of outside heaters 56, 57, 58 and 59, delivering thermal energy to the outer surfaces of the container body and lid. Each heater 58 faces one container surface each. Heater 57 faces two surfaces, one of container body and one of lid, thus requires higher energy (about 10-40% higher than heaters 58) for better energy delivery. Heater 56 is positioned at the top of the container, and can use the same power as the heater 58. Heater 59 is positioned on top of the body surface, and uses less energy (about 10-40% less than heater 58).

In an embodiment, the present invention discloses a chamber for cleaning containers, with an optimized configuration of nozzle positions for best surface cleaning. In addition, the configuration offers minimum liquid residue, helping in subsequent vacuum drying process.

In an embodiment, one or more humidity sensors can be provided to measure the humidity level within the cleaning chamber, which then can be used to monitor the drying process, and to detect the end point of the drying process.

In an embodiment, the present invention discloses an integrated wet cleaning and vacuum drying sequentially performed in a same cleaning chamber. In addition, vacuum pumping can also be performed during the wet cleaning process to remove liquid vapor during the cleaning process. In addition to cleaning articles, the present cleaning process and chamber can condition new articles, such as degassing and/or aging new plastic containers.

In an embodiment, the cleaning and vacuum drying can be performed in a same cleaning chamber, increasing the throughput by minimizing movements of the articles to be cleaned. Vacuum drying and liquid cleaning are compatible processes, so both can be performed in a same process chamber without interference. In addition, vacuum can be applied during the cleaning process to enhance liquid vapor removal, further reducing the drying time. Heating can also be applied during the cleaning process to add in increasing the volatility of the cleaning or rinsing liquid, further reducing the drying time.

In an embodiment, the present invention discloses a heated vacuum decontamination and degassing process and chamber. A heater, such as an IR heater, can be applied to the articles in vacuum to accelerate evaporation of volatile organic components and other contamination particles from the articles. In an embodiment, the decontamination chamber can be integrated to the dryer chamber, utilizing the heater and the vacuum components of the dryer chamber. In another embodiment, the decontamination chamber comprises a separate heated vacuum chamber, for example, to increase the processing throughput.

In an embodiment, the present system comprises a controller for controlling the cleaning process. The controller can accept inputs from an operator or from a host, telling which cleaning procedures are to be performed for which articles. For example, some containers will be cleaned and dried, then undergo heated vacuum decontamination for outgassing. In some cases, some containers go directly to heated vacuum for outgassing without cleaning/drying.

In an embodiment, the present system comprises an inspection station to inspect incoming and out going articles. For example, a container can be inspected before cleaning or vacuum process. In some cases, only selected containers will be inspected before cleaning and/or decontamination. In some cases, some containers undergo inspection only with no cleaning or decontamination process. In some cases, some containers undergo inspection and decontamination process only.

In an embodiment, the present system comprises manual load ports for operator access, or automatic load ports, such as overhead transport (OHT). Loader buffers can also be included.

In an embodiment, the present invention discloses a chamber for cleaning and drying an article, comprises a liquid delivery system delivering a cleaning mixture to the article; a vacuum system delivering sub-atmospheric pressure to the chamber; and a heater system delivering thermal energy to the article, wherein the article is cleaned and dried in the same chamber, wherein the article is liquid cleaned using the cleaning mixture, and wherein the article is vacuum dried using the thermal energy to avoid liquid freezing. In an embodiment, the cleaning mixture comprises a mixture of a liquid cleaner and a gaseous carrier gas. The liquid delivery system can further deliver a rinsing mixture to the article after delivering the cleaning mixture, or a purge gas to the article after delivering the cleaning mixture. The chamber can further comprise degassing and decontaminating the article in a heated vacuum ambient. The vacuum pump system can evacuate liquid and gaseous materials.

In an embodiment, the present invention discloses a cleaner system for cleaning and drying a container, comprises a load port for accepting the container; a vacuum sealed cleaning chamber comprising a plurality of nozzles for delivering a cleaning mixture to the surfaces of the container; a plurality of IR heaters for delivering thermal energy to the surfaces of the container; and a pumping system for delivering sub-atmospheric pressure to the cleaning chamber; and a robot handling system for transferring the container between the load port and the cleaning chamber, wherein the container is cleaned and dried in the same chamber, wherein the container is liquid cleaned using the cleaning mixture, and wherein the container is vacuum dried using the thermal energy to avoid liquid freezing. In an embodiment, the plurality of nozzles further delivers a rinsing mixture to the container after delivering the cleaning mixture. The plurality of nozzles can further deliver a purge gas to the container after delivering the cleaning mixture. The container can comprise multiple portions which are disassembled and positioned separately in the cleaning chamber. The vacuum pump system can evacuate liquid and gaseous materials. The cleaning is performed at sub-atmospheric pressure. In an embodiment, the system further comprises a separate chamber for degassing and decontaminating the container.

Figure 10:
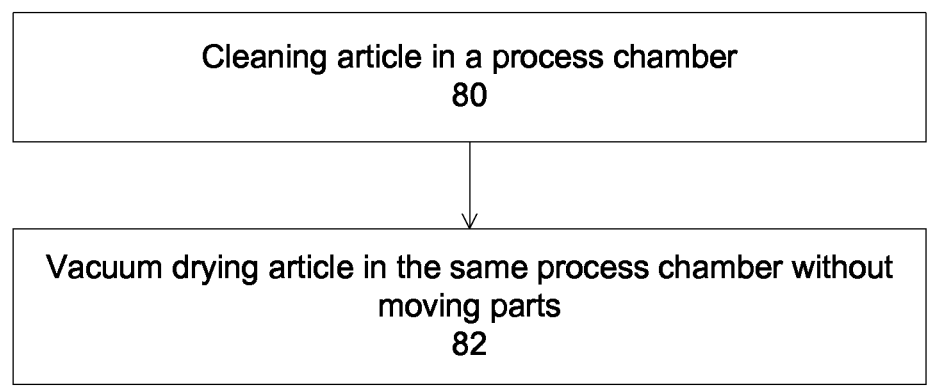
FIG. 10 illustrates a flow chart for an integrated cleaning according to an embodiment of the present invention.

In an embodiment, the present invention discloses methods for cleaning semiconductor articles, using an integrated cleaning chamber comprising cleaning nozzles for delivering cleaning solutions and heater and vacuum system for vacuum drying. FIG. 10 illustrates a flow chart for an integrated cleaning according to an embodiment of the present invention. Operation 80 delivers a cleaning process to the article. Operation 82 delivers a vacuum drying process to the article, in the same process chamber and without any moving parts. Operation 84 delivers an optional heated/vacuum decontamination process, in the same process chamber or in a different process chamber. Process variations can be provided, for example, a cleaning process comprises delivering cleaning solutions (or cleaning mixtures) for cleaning, followed by a rinsing solution and then a purge gas for removing liquid residue. A vacuum drying process can comprise sealing the process chamber and pumping it down to sub-atmospheric pressure, such as ten Torr, Torr, or sub-Torr regimes. The vacuum drying process can comprise heating the article, for example, by IR heaters, to assist in the liquid evaporation process, preventing liquid freezing. A typical cleaning and drying process can be performed in a few minutes, for example, less than 10 minutes. Heated vacuum decontamination process can be at higher temperature and lower pressure, or at same temperature and pressure as the drying process. A typical decontamination process can be performed in less than an hour.

In an embodiment, the present invention discloses a method for cleaning an article, comprises cleaning the article using a liquid cleaning mixture in a process chamber; vacuum drying the article in the same process chamber; and applying thermal energy to the article during at least a portion of the vacuum drying time. The method can further comprises rinsing the article using a rinsing mixture in the same process chamber; purging the article using a purging gas in the same process chamber; degassing and decontaminating the article in a heated vacuum ambient in the same process chamber; or degassing and decontaminating the article in a heated vacuum ambient in a different process chamber. In an embodiment, the article comprises multiple portions which are disassembled and positioned separately in the cleaning chamber.

Figure 11:
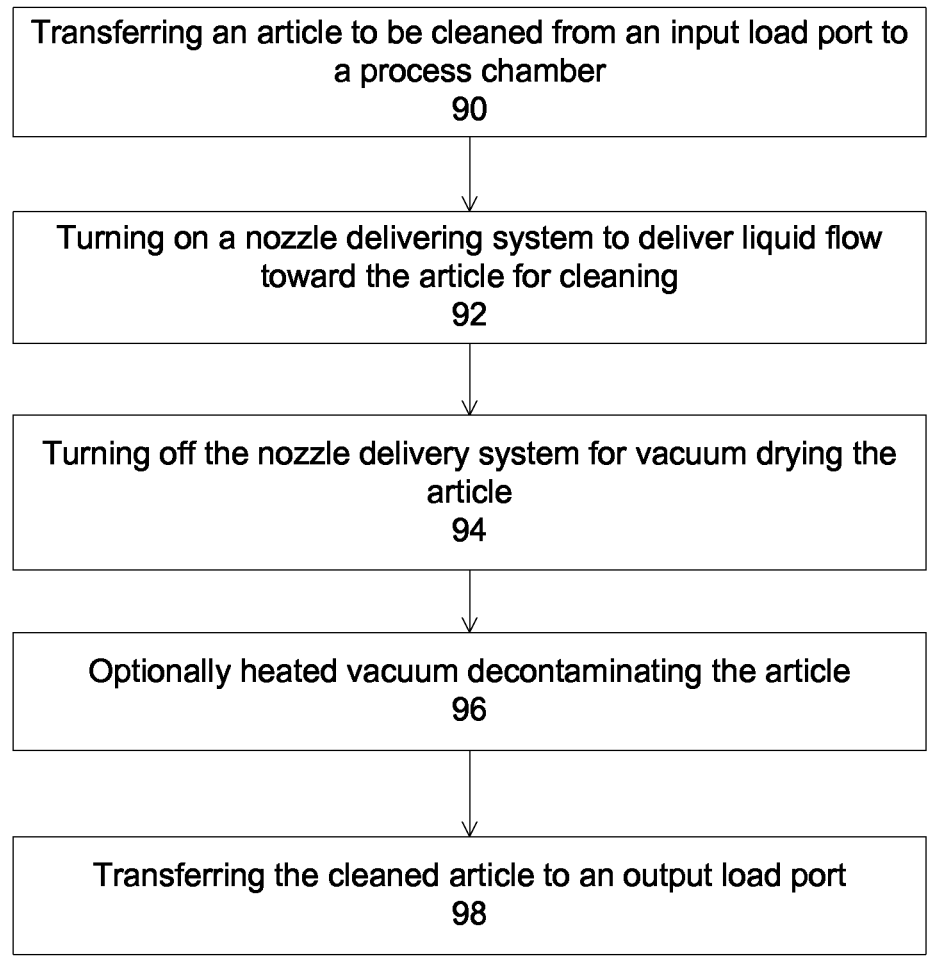
FIG. 11 illustrates another flow chart for an integrated cleaning according to an embodiment of the present invention.

FIG. 11 illustrates another flow chart for an integrated cleaning according to an embodiment of the present invention. Operation 90 transfers an article to be cleaned from an input load port to a process chamber. If the article comprises multiple portions, the article is disassembled into separate portions and each portion is transferred to its appropriate location in the process chamber. For example, a FOUP can be opened (e.g., by a stand alone opening station or by a robot effector during robot transfer), and then the body and the lid are placed in a basket of the process chamber. The basket is then lowered. After delivering the article, the process chamber is closed. Operation 92 turns on cleaning nozzles to deliver liquid flows toward the article. In an embodiment, the liquid is heated. The liquid can be a solution mixture, for example, a mixture of a liquid and a delivery gas. In an embodiment, the chamber is sealed and pumped to sub-atmospheric pressure. A drainage system can drain the cleaning liquid. In addition, the pumping process can pump out gaseous, vapor, liquid, or any combination thereof, removing both gaseous and liquid from the process chamber. In an embodiment, a heater is turned on to heat the article, and/or the process chamber walls. After cleaning, rinsing solutions or mixtures can be delivered by the nozzles to the article for rinsing. Optional gas purge can be delivered afterward for reducing liquid droplets remaining on the article surfaces. The solution mixtures and gases can be heated to facilitate vapor removal.

Operation 94 turns off the nozzle delivery system for vacuum drying the article. Heaters can be turned on for heating the article to reduce liquid droplets from freezing on the article surfaces. If the vacuum pump has been turned on during the cleaning process, it can be maintained, or its pumping speed can be increased to further reduce the chamber pressure for faster liquid evaporation. If the cleaning process is performed at or above atmospheric pressure, the vacuum pump is turned on to reduce the chamber pressure for vacuum evaporation of liquid residue. If the heater has been turned on during the cleaning process, it can be maintained, or its temperature can be increased to further increase the article surface temperature for faster liquid evaporation. If the cleaning process is performed without heating the article, the heater can be turned on to prevent liquid freezing.

For integrated decontamination, e.g., if the decontamination is built into the process chamber, operation 96 further performs heated vacuum decontamination process for volatile organic component removal, or other decontamination procedures. Heater temperature and chamber pressure can be the same, or different, than the drying process. Typically, the decontamination is longer than the drying time.

For separate decontamination chamber, the article, for example, a container body and a container lid, is transferred together to the decontamination chamber from the cleaning chamber. At the decontamination chamber, a decontamination process is performed.

After decontamination, operation 98 transfers the article to an output load port. For multiple portion articles, such as a container having a body and a lid, the multiple portions are assembled and locked together before reaching the load port. For example, the process chamber is open, and the basket rises. The body and the lid are unloaded from the basket (of the decontamination chamber or the cleaning chamber), and the lid is assembled and locked to the body before delivery to the load port (a manual loading platform or an automatic overhead transport). The input load port and the output load port can be the same load port. Alternatively, the input load port and the output load port can be different load ports, for example, to avoid contaminating the cleaned container or to increase the cleaning throughput.

In an embodiment, the present invention discloses an improved robotic transfer for faster throughput, especially for multiple portion articles, such as semiconductor containers comprising a container body and a container lid.

In a prior art conventional cleaning apparatus for cleaning substrate containers, a FOUP is picked up from the input load port and placed on a FOUP opener station where the lid is opened and separated from the body. A robot then picks up the body and the lid separately and transfers each to a cleaning station where the lid and body are cleaned. After cleaning, the cleaned body and lid are transferred to an assembly station to be assembled together before being sent to an output station. There can be a lot of robot movements before the cleaning process can be started, affecting the throughput of the cleaning process.

Figure 12:
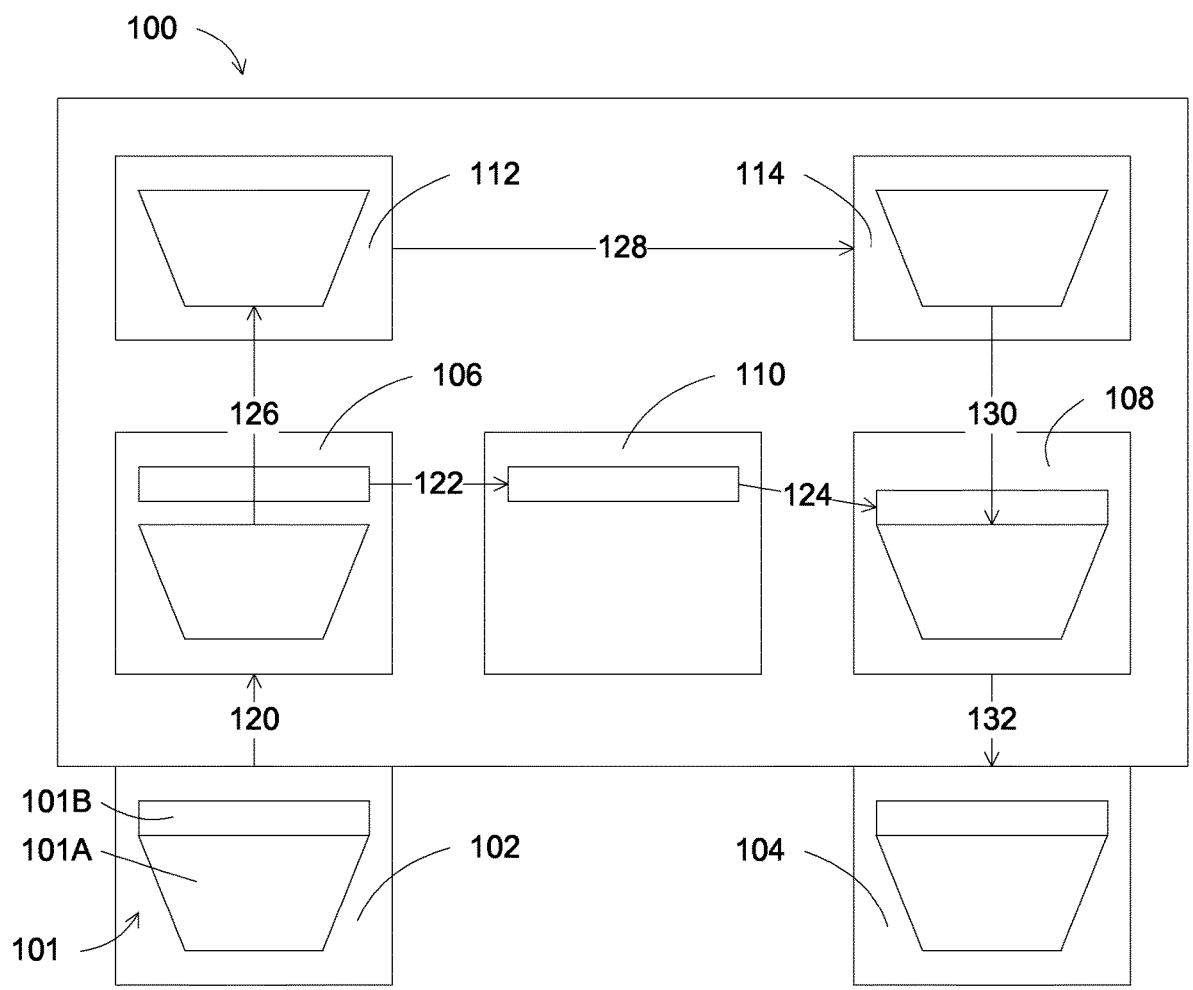
FIG. 12 illustrates a prior art container cleaner system.

FIG. 12 illustrates a prior art container cleaner system 100, comprising an input load port 102, an output station 104, an opener station 106, an assembly station 108, a lid clean station 110, a body clean station 112 and a body drier station 114. In operation, an empty FOUP 101 comprising a body 101A and a lid 101B is placed on the input load port 102, either by an operator or by an automatic transport. The FOUP 101 is typically closed, meaning the body 101A and lid 101B are engaged together and transferred as a unit. A first robot movement 120 transfers the closed FOUP 101 to the opener station 106. At the opener station 106, a robot opener mechanism opens the FOUP 101 to separate the lid 101B from the body 101A. After separation, a second robot movement 122 transfers the lid 101B to the lid cleaning station 110. After clean, a third robot movement 124 transfers the cleaned lid 101B to the assembly station 108 to be assembled with a cleaned body. After the lid 101B is transferred out of the separation station 106, a fourth robot movement 126 transfers the body 101A to the body cleaning station 112 and a fifth robot movement 128 transfers the cleaned body to the drier station 114. A sixth robot movement 130 then transfers the cleaned and dried body to the assembly station 108 to be assembled with the cleaned lid. After assembly, the closed FOUP is transferred by a seventh movement 132 to the output station 104. Thus there can be a lot of robot movements in a container cleaner system.

In an embodiment, the present invention provides methods and automated apparatuses for cleaning multiple portion articles or semiconductor substrate containers with an integrated robot movement. Also, the present invention transfers the container body and lid together, either from an input port to separate locations to be cleaned, or from separate cleaning locations to an output port. In an embodiment, the present invention automatically unlocks (e.g., decoupled) and/or locks (e.g., re-coupled) the container body and lid from and/or to each other. Advantages of the present inventions include simplifying the numbers of movements within a cleaner system, simplifying the components of the cleaner, and providing smaller footprint, leading to better process efficiencies. The present automated apparatuses include a transfer robot for a semiconductor system, and a semiconductor system such as a cleaner system employing the robot.

The following description describes a container having a body and a lid. However, the present invention is not so limited, and can be applied toward any articles having multiple portions that can be assembled and disassembled, for example, for cleaning.

The containers according to embodiments of the present invention comprise a separate container body and a lid, which then can be coupled and locked together to form a closed container. In addition, the container can include support components for holding substrates, handling components to be manipulated or transported by an operator or an automatic transport, and locking components to be manually or automatedly coupled or decoupled. For example, an engaging member can secure the lid and body together, and when the engaging member is released, the lid can be separated from the body. A gripper on an upper surface of the container can allow a robot or an operator to carry the container between locations in a fabrication facility.

Figure 13A:
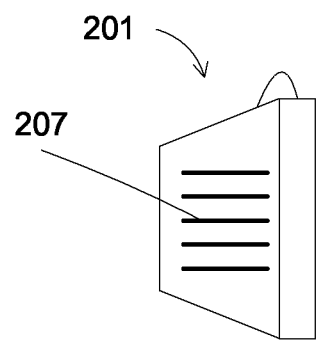
FIG. 13A illustrates an exemplary closed container holding a plurality of substrates.

FIG. 13A illustrates an exemplary closed container 201 holding a plurality of substrates 207. In typical operating conditions, the substrates 207 are positioned horizontally for ease of handling and storage, thus the container 201 is typically positioned as shown, with the lid and body disposed next to each other. A side opening mechanism, such as an operator or an automated handler, can be engaged to the lid to release the lid from the body. The lid releasing mechanism typically includes a separating action to separate the lid from the body, and an upward or downward movement to expose the inner portion of the container for accessing the substrates 207, which stay within the container body.

Figure 13B:
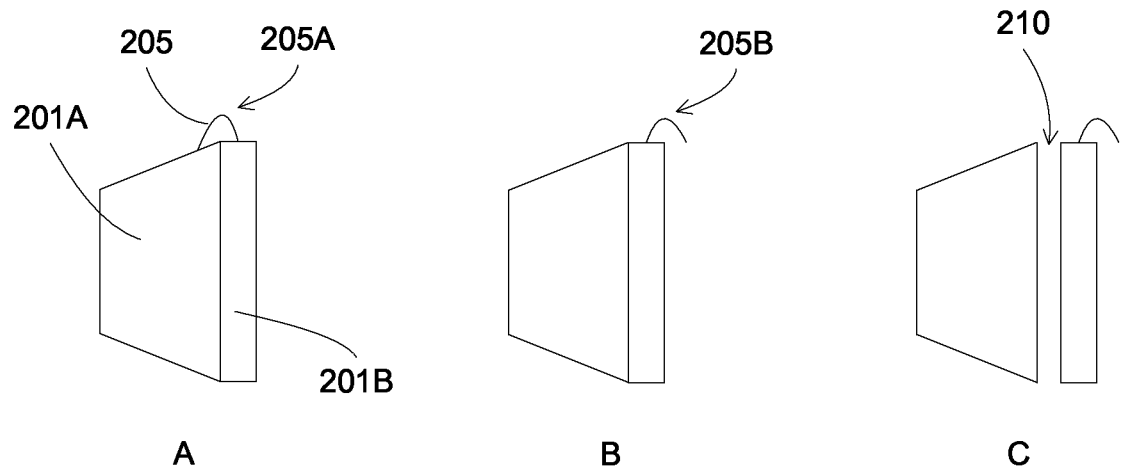
FIGS. 13B (A)-(C) illustrate the same container shown in FIG. 13A without the substrates.

FIG. 13B illustrate the same container 201 but without the substrates. The container comprises a container body 201A, configured to hold the plurality of substrate 207, a container lid 201B, and a locking mechanism 205. FIG. 13B (A) illustrates an empty closed container with one or more locking mechanism(s) 205 engaged 205A to lock the lid 201B and the body 201A together. One locking mechanism 205 is shown, with simplified schematic. FIG. 13B (B) illustrates an empty container with the locking mechanism 205 released 205B to unlock or decouple the lid and the body. FIG. 13B (C) illustrates an empty container with the locking mechanism released and the lid and body separated 210.

Figure 14A:
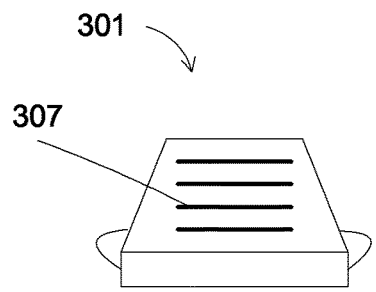
FIG. 14A illustrates an exemplary closed container holding a plurality of substrates.

FIG. 14A illustrates another exemplary closed container 301 holding a plurality of substrates 307. In typical operating conditions, the container 301 is typically positioned as shown, with the lid and body disposed on top of each other. A bottom opening mechanism, such as an operator or an automated handler, can be engaged to the lid to lower the lid from the body, releasing the lid cover for accessing the substrates 307. The lid releasing mechanism typically includes a downward movement of the lid to separate the lid from the body, with the substrates 307 staying with the lid, thus exposing the substrates 307 for robotic access.

Figure 14B:
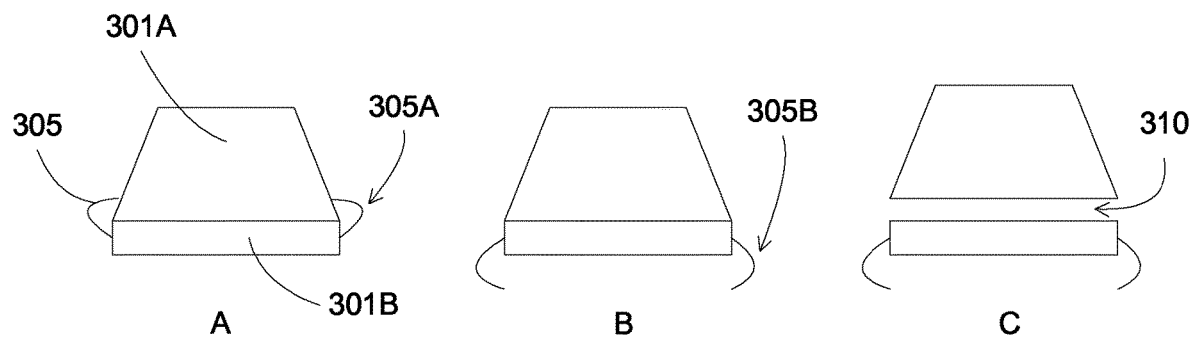
FIGS. 14B (A)-(C) illustrate the same container shown in FIG. 14A without the substrates.

FIG. 14B illustrate the same container 301 but without the substrates. The container comprises a container body 301A, configured to hold the plurality of substrate 307, a container lid 301B, and one or more locking mechanism(s) 305 with two locking mechanisms shown. FIG. 14B (A) illustrates an empty closed container with the locking mechanisms 305 engaged 305A to lock the lid 301B and the body 301A together. FIG. 14B (B) illustrates an empty container with the locking mechanisms 305 released 305B to unlock or decouple the lid and the body. FIG. 14B (C) illustrates an empty container with the locking mechanism released and the lid and body separated 310.

In an embodiment, the present invention discloses methods and apparatuses for transferring containers, incorporating various container movements into a robot integrated movement. An exemplary integrated movement comprises transferring all portions (e.g., the lid and body of a container) together and depositing the portions separately in different locations for cleaning. Another exemplary integrated movement comprises unlocking/locking the lid and body during the container transfer.

Figure 15:
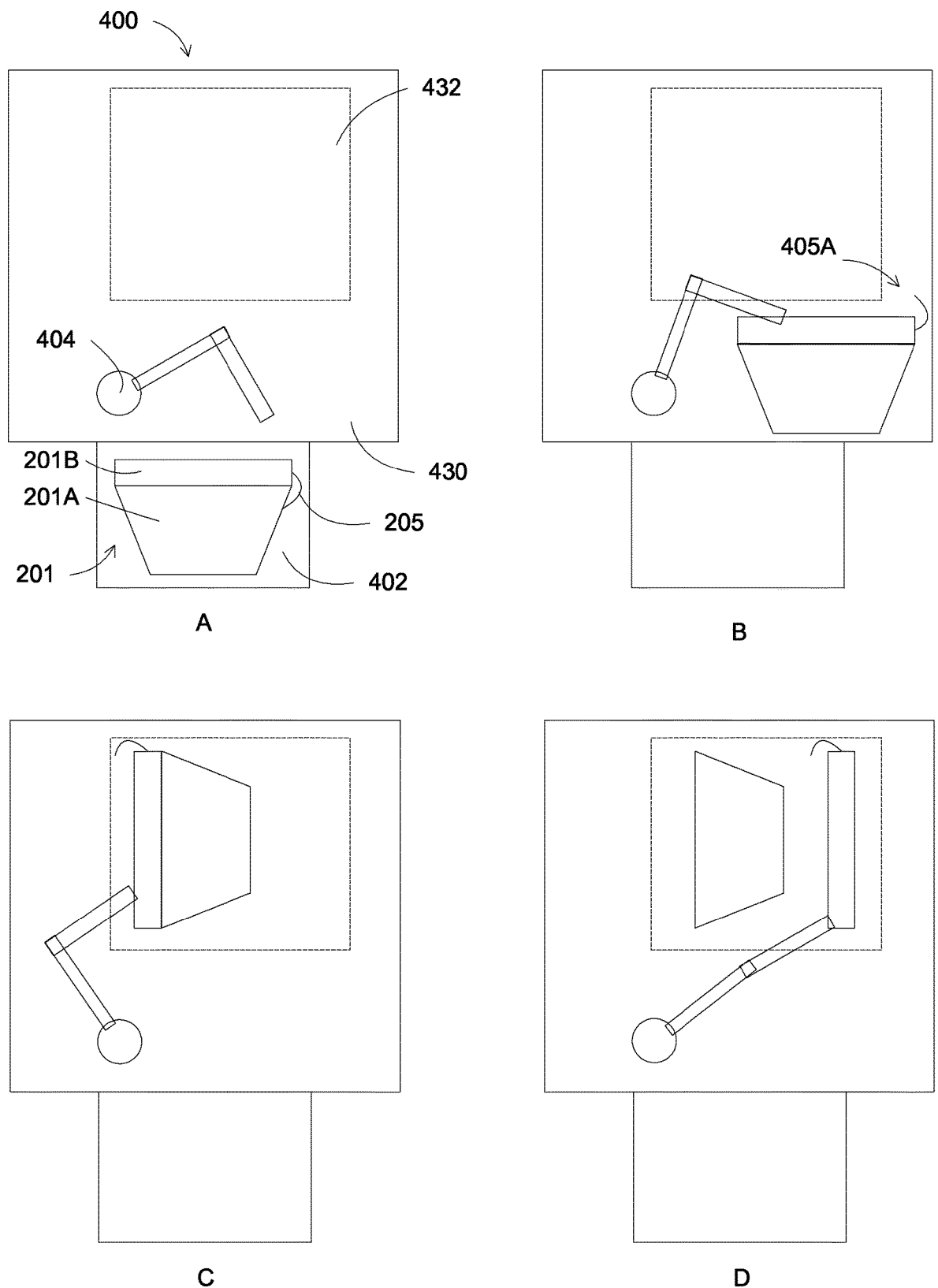
FIG. 15 illustrate an exemplary cleaning apparatus according to embodiments of the present invention with a sequence of container deposition.

FIG. 15 illustrate an exemplary cleaning apparatus 400 according to embodiments of the present invention, comprising a load port 402 connected to a housing 430 having a cleaning station 432 and a robot 404 for handling containers to be cleaned. The cleaning apparatus 400 also comprises other components (not shown), such as computer controller, exhaust air fan and duct, cleaner supply and drainage. The cleaning apparatus 400 can also include multiple cleaning stations, separate decontamination/degas stations (such a heated vacuum decontamination chambers), and inspection stations.

As shown in FIG. 15(A), a container 201 is loaded to the load port 402 to be cleaned by the cleaning apparatus 400. The container 201 is typically empty and is in a closed and locked position, meaning the container body 201A and the lid 201B are attached together with the locking mechanism 205 engaged. The container 201 can be placed to the load port 402 manually, for example by an operator, or in an automated fashion, for example by an automated transport such as an overhead hoist transport (OHT). The load port 402 can be an input/output load port or an intermediate load port connected to an input/output load port. One load port 402 is shown, but multiple load ports can be connected to the housing 430. Also the load port 402 is shown as an input/output load port, meaning the same load port is used for input and output, but dedicated input and output load ports can be included in the cleaning apparatus 400. As shown, the container 201 is in locked position, but other configurations can be used, such as unlocked, or unlocked and separated into body and lid.

In an embodiment, the load port 402 can have an input door connected to the outside environment. After the input door opens, a container 201 is placed in a support member (not shown), either manually or using automation, and the input door is closed. The environment within the load port 402 is cleaned, for example, by blowing fans from the top and exhaust ducts at the bottom to generate a clean laminar air flow. After the load port is cleaned, an output door connecting the load port 402 with the housing 430 is opened to allow robot 404 to access the container 201. Alternatively, the cleaning apparatus 400 does not have input or output doors, just a cleaning environment in the load port 402 and the housing 430. In that case, a container 201 placed in the load port 402 can be accessed by robot 404 immediately.

Robot 404 picks the whole container 201 from the load port 402 in the locked configuration and transfers it to the housing 430 (FIG. 15(B)). During the transfer, the container is unlocked 405A, either by a mechanism located on the robot 404 or located in the housing 430. Additional movement by the robot 404 can be added, for example, by moving, turning or rotating a robot arm so that the lid or the body is facing downward. In this position, the lid and the body are supported by gravity, so that after unlocking, the lid and the body are not separated. For example, the robot 404 comprises a robot arm gripping the lid of the container. In a locked configuration, the body is attached to the lid by the locking mechanism, thus the container is transported as a whole. After turning the robot arm so that the lid is located at the bottom of the container, the locking mechanism is released. The body is still attached to the lid by weight, pressing on the lid.

Robot 404 then transfers the unlocked container to the cleaning station 432, sequentially depositing the container body (FIG. 15(C)) and the lid (FIG. 15(D)). In an embodiment, the cleaning station 432 can comprise a basket with up/down movement to facilitate the deposition of the body and the lid. The cleaning station 432 can have doors to isolate the cleaning station from the housing 430 environment. For example, the cleaning station 432 can be cleaner than the housing 430, or the cleaning station 432 can be a vacuum station while the housing 430 is under atmospheric pressure. The robot 404 can have separate grippers to grip the lid and body separately, thus can release them at appropriate locations. The robot can have a gripper gripping either the lid or the body, with the other component supported by weight. For example, a robot arm can grip the lid with the body attached by weight on top in unlocked configuration. The robot arm then deposits the body to its cleaning location, for example, by some support members at the cleaning location. Afterward, the robot arm moves to the lid cleaning location, and releases the gripper to deposit the lid to its cleaning location.

After depositing the container with its separate members (e.g., lid and body) to the appropriate cleaning locations, the cleaning action of the cleaning station 432 is started to clean the lid and body. The cleaning action can comprise liquid or gas cleaning, drying action for drying the container members, or a combination of cleaning and drying. In an embodiment, the cleaning action employs the integrated cleaning with vacuum drying, together with vacuum decontamination as described above.

In an exemplary embodiment, the cleaning station 432 comprises an integrated cleaning and drier system. The integrated cleaning system provides a sequence of wet cleaning and vacuum drying in the same process chamber, with optional IR heating and humidity sensor monitoring. The cleaning process can comprise cleaning chemical and deionized water, delivered by ultrasonic, aerosol or high pressure spray to remove impurities and contaminate particles, such as metal contamination. The cleaning process can also provide minimum liquid residue to assist in vacuum drying, such as rationing the amount of cleaning and rinsing liquid with hot gas, hot liquid, fast evaporating liquid cleaners, and good drainage with no liquid retention and no liquid dead spots. Cyclic cleaning processes can be performed for effective cleaning.

Figure 16:
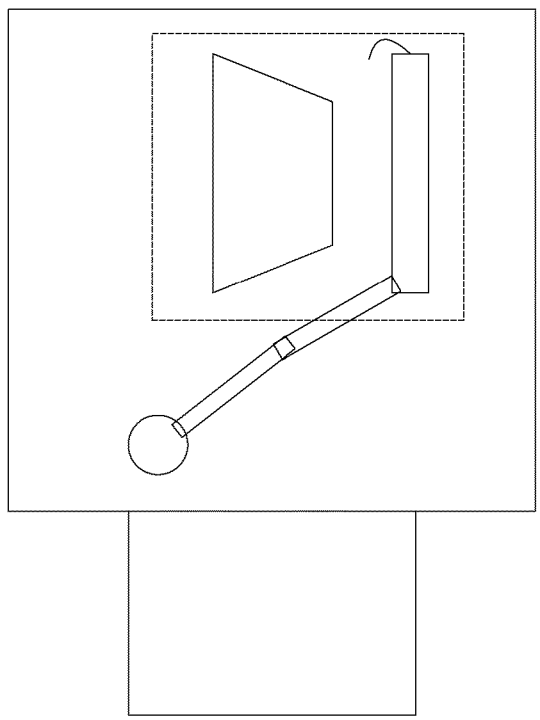
FIG. 16 illustrate the cleaning apparatus shown in FIG. 15 with a sequence of container retrieval.
Figure 16:
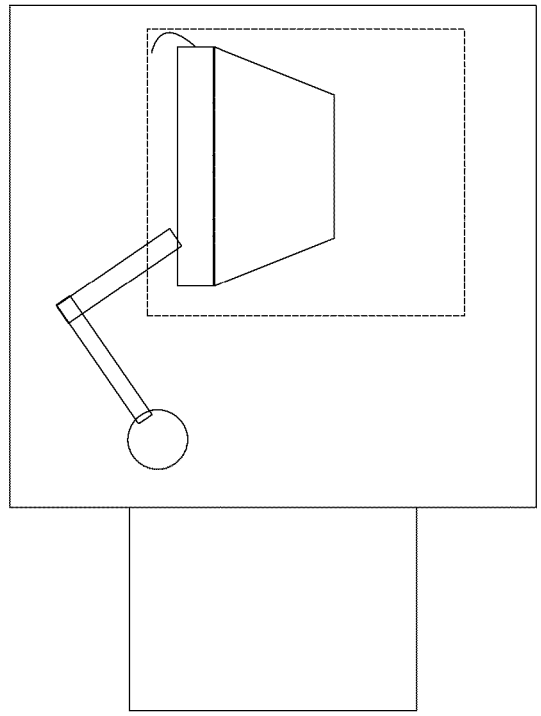
Figure 16:
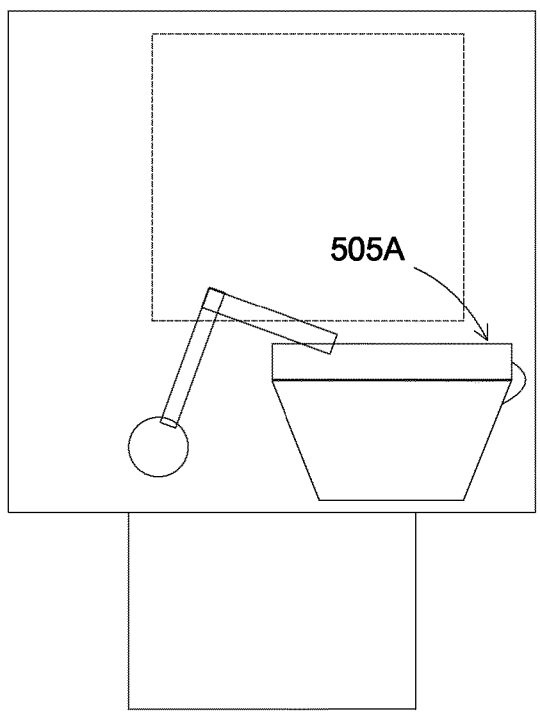
Figure 16:
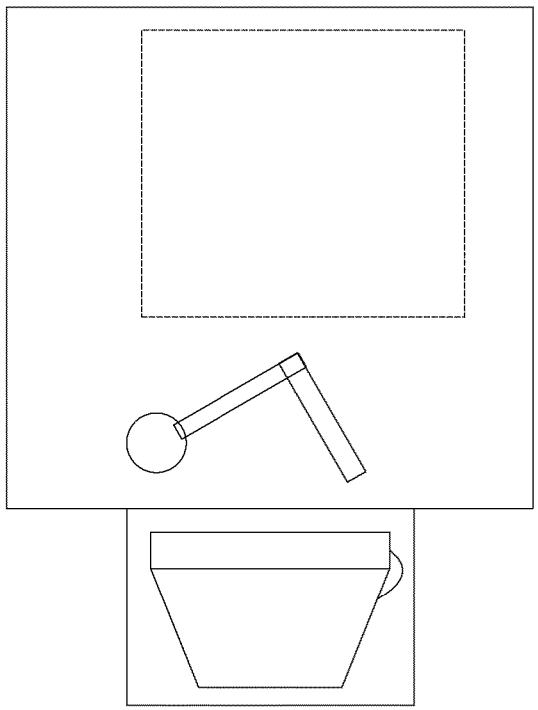

FIG. 16 illustrate the same cleaning apparatus with a sequence of container retrieval. After cleaning, the robot retrieves the lid (FIG. 16(A)), moves to the body and retrieves the body (FIG. 16(B)). If the cleaning station has isolated doors, the environment of the cleaning station can first be equalized with the outside housing before opening the doors. For example, if the cleaning station is under vacuum, purge gas is introduced to bring the cleaning station to atmospheric pressure before opening the isolated doors.

After retrieving the body and the lid, the robot transfers them to the load port. During the transfer, the lid and the body are coupled and the lock mechanism engaged to lock the lid and the body together 505A (FIG. 16(C)), and the robot moves the locked container to the load port (FIG. 16(D)). The same mechanism that unlocks the container can be used to lock the lid and the body together. The robot picks up the body and the lid in appropriate orientations, for example, to ensure that the body is supported on the lid by weight. In addition, after locking the container, the container can be positioned in appropriate orientation before arriving at the load port. The same load port for input can be used for output, or a separate output load port can be used.

In an embodiment, the integrated movement comprises an orientation action to position the container in appropriate orientation. For example, orientation actions include turning a robot arm to position a container body on top of the lid (or the lid on top of the body), and turning a container to fit into the output load port.

Figure 17:
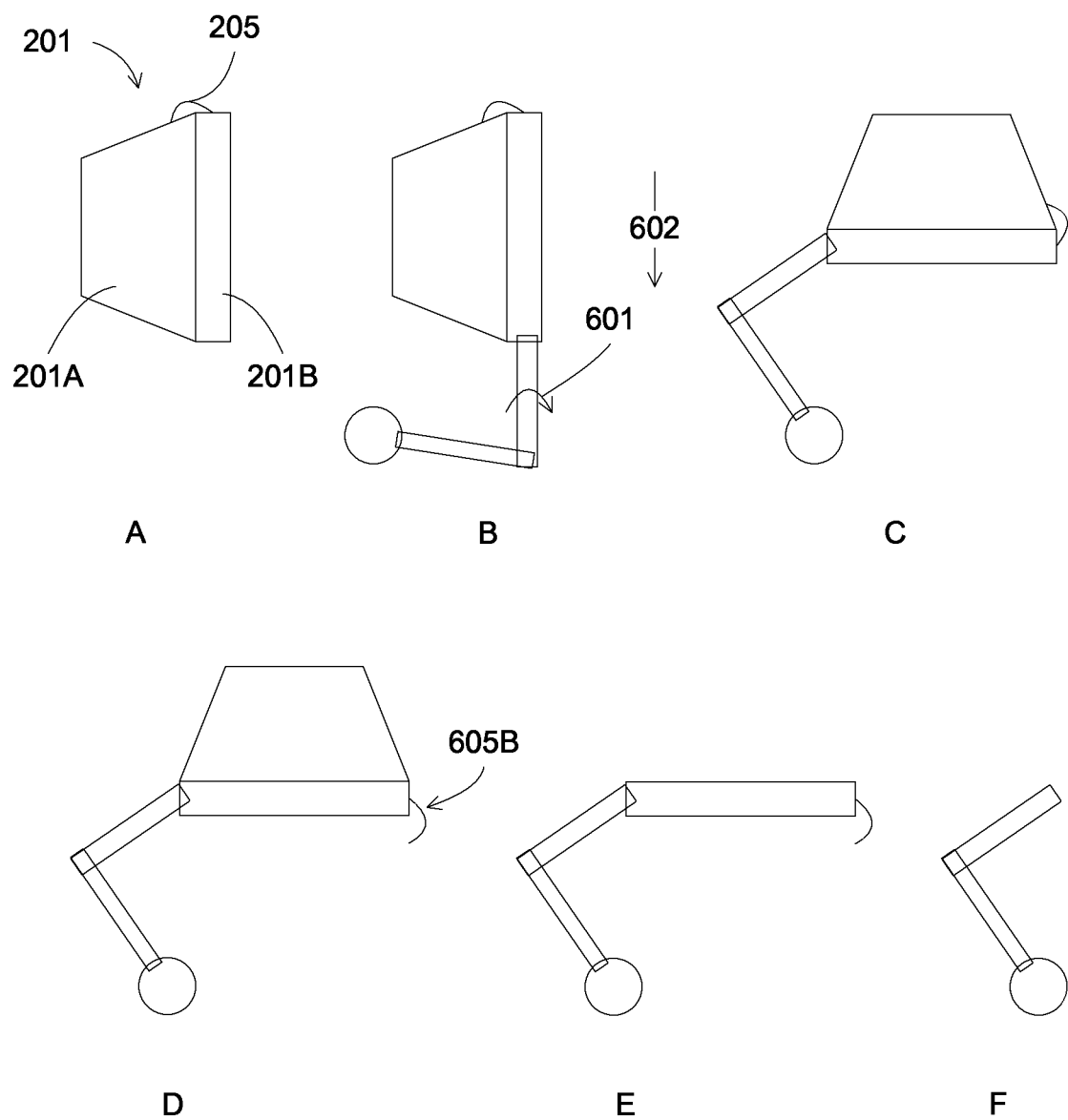
FIG. 17 illustrate a sequence of exemplary robot movements according to embodiments of the present invention.

FIG. 17 illustrate a sequence of exemplary robot movements according to embodiments of the present invention. FIG. 17(A) illustrates a container 201 having a body 201A and a lid 201B together with an engaged locking mechanism 205. FIG. 17(B) illustrates a robot picking the container 201 at the lid. Alternatively, the robot can pick up the container at another location, such as the container body. The robot can also pick up the container at multiple locations, such as the container body and lid. After picking up the container, the robot moves the container to appropriate locations, such as the cleaning station. During the move, additional actions can be performed, such as rotating 601 the robot arm to orient the container, for example, to align the container with gravity 602. In FIG. 17(C), the container is oriented so that the body is on top of the lid, since the robot grips the container by the lid. In this orientation, after the lock mechanism is released, the body is supported by gravity on the lid. In FIG. 17(D), the locking mechanism is released 605B. With the proper orientation, the lid and the body are still handled by the robot, even though only the lid is gripped by the robot arm.

When the container reaches the location of the body, the body is placed in its location (FIG. 17(E)). The robot continues its transfer, moving to the location of the lid. After reaching the location of the lid, the robot deposits the lid and returns to a standby position (FIG. 17(F)). Alternatively, the body and the lid can be parallely placed, e.g., placing at about a same time, in its appropriate locations.

In an embodiment, the present invention discloses a robot system to perform the integrated transfer movement, which comprises transferring a lid and a body of a container as a whole, together with an optional locking/unlocking action and an optional orientation action during the transfer. The robot can comprise one or more grippers to handle the lid and the body of the container, together with optional mechanism for locking/unlocking the container.

Figure 18:
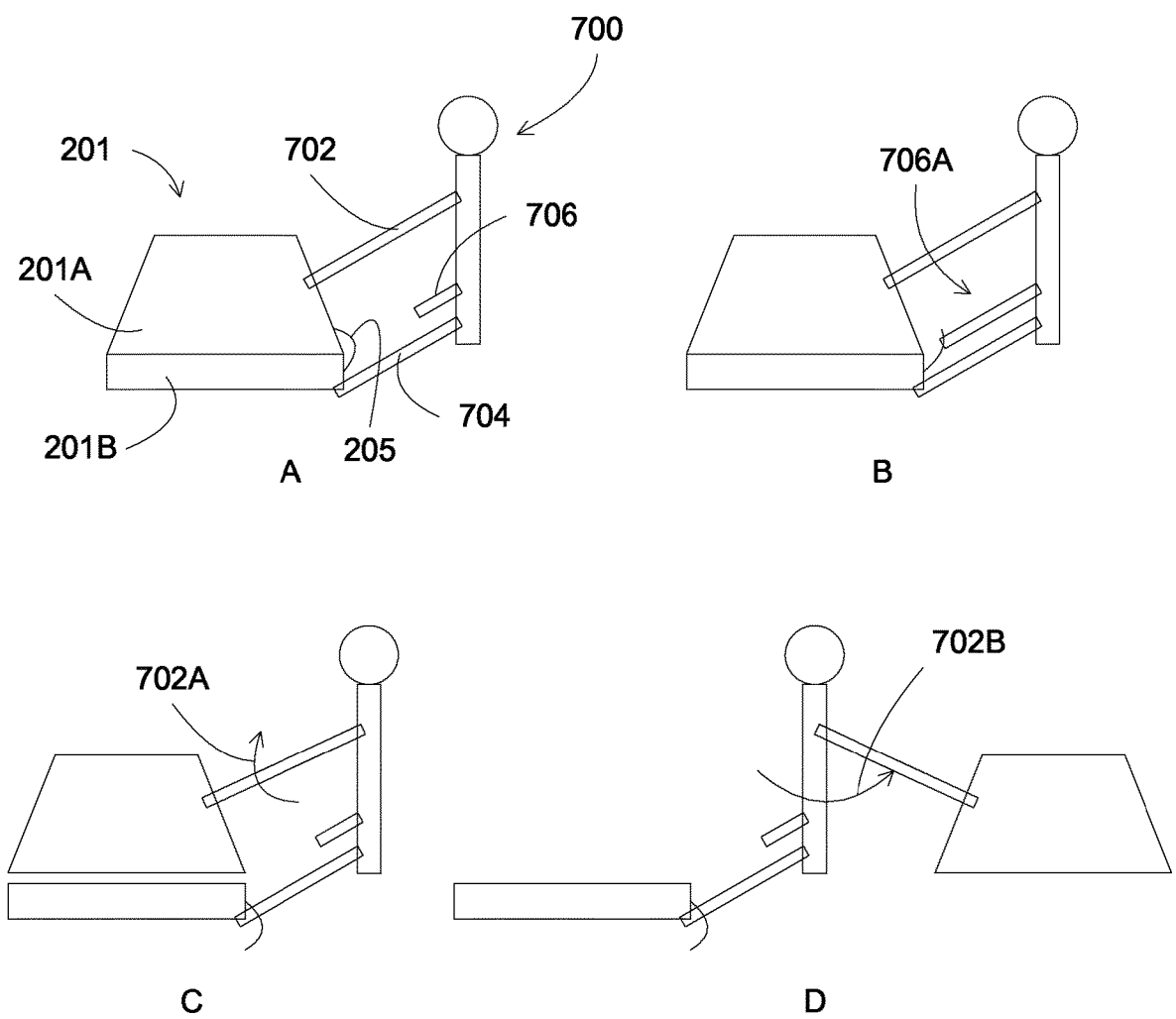
FIG. 18 illustrate an exemplary sequence of an exemplary integrated movement according to embodiments of the present invention.

FIG. 18 illustrate an exemplary sequence of an exemplary integrated movement, together with a robot according to embodiments of the present invention. The robot 700 comprises a first gripper 702 for handling a container body, a second gripper 704 for handling a container lid, and a locking/unlocking member 706 for locking and unlocking the lock of the container. The robot 700 can also perform other actions, such as rotating and moving, to grip and to deposit the container members. The grippers 702 and 704 are connected to a common arm to allow synchronous movements. The robot 700 shows an exemplary configuration, but other configurations are within the scope of the present invention, for example, a common arm connected to two or more gripper arms with each gripper arm handling a member of the container.

FIG. 18(A) illustrates a robot 700 gripping a container 201, with arm 702 gripping container body 201A and arm 704 gripping container lid 201B. With multiple arms gripping multiple members of the container 201, the orientation of the container is not critical, e.g., the container can be positioned in any orientation. The container 201 is shown in locked configuration 205, and the locking/unlocking member 706 of the robot is in standby position, e.g., refracted. This figure can illustrate a container just received by a robot after being placed in a load port with the container typically empty and closed (e.g., locked). Robot 700 can extend to the load port, having arm 702/704 approaching and gripping body 201A/lid 201B respectively.

After receiving the container, the robot 700 transfers the container to appropriate locations, such as locations in a cleaning station. During the transfer, additional action can be performed, such as locking/unlocking and assembling/separating the container. FIG. 18(B) illustrates an exemplary configuration of unlocking actions, comprising member 706 extending to engage configuration 706A to unlock the container, e.g., releasing the lock that locks the lid to the body. The member 706 returns to a standby position, e.g., retracted, after completing the lock releasing action. FIG. 18(C) illustrates an exemplary configuration of separating actions, comprising arm 702 moving 702A to separate the body from the lid. Alternatively, other movements can be performed, such as moving the arm 704 to separate the lid from the body, or moving both arms 702 and 704 together. The separating action can be combined with the individual movements of the arms 702 and 704 when placing the body and lid to their cleaning locations.

After the lid is unlocked from the body, the body and the lid can be sequentially (or serially) placed in its appropriate locations. For example, FIG. 18(D) illustrates arm 702 moving 702B to a cleaning location of body. When reaching the cleaning location, arm 702 can place the body in its appropriate orientation and position, and retract to a standby position. Sequentially or simultaneously, arm 704 can transfer the lid in its appropriate orientation and position.

Alternatively, the body and the lid can be parallely placed, e.g., placing at about a same time, in its appropriate locations. For example, arms 702 and 704 are moving at about a same time to the appropriate locations of the body and the lid, where the body and the lid are parallely placed.

To retrieve the container after cleaning, the sequence can be performed in reverse, for example, picking the lid and the body sequentially, and assembling/locking during transferring to a load port.

Figure 19:
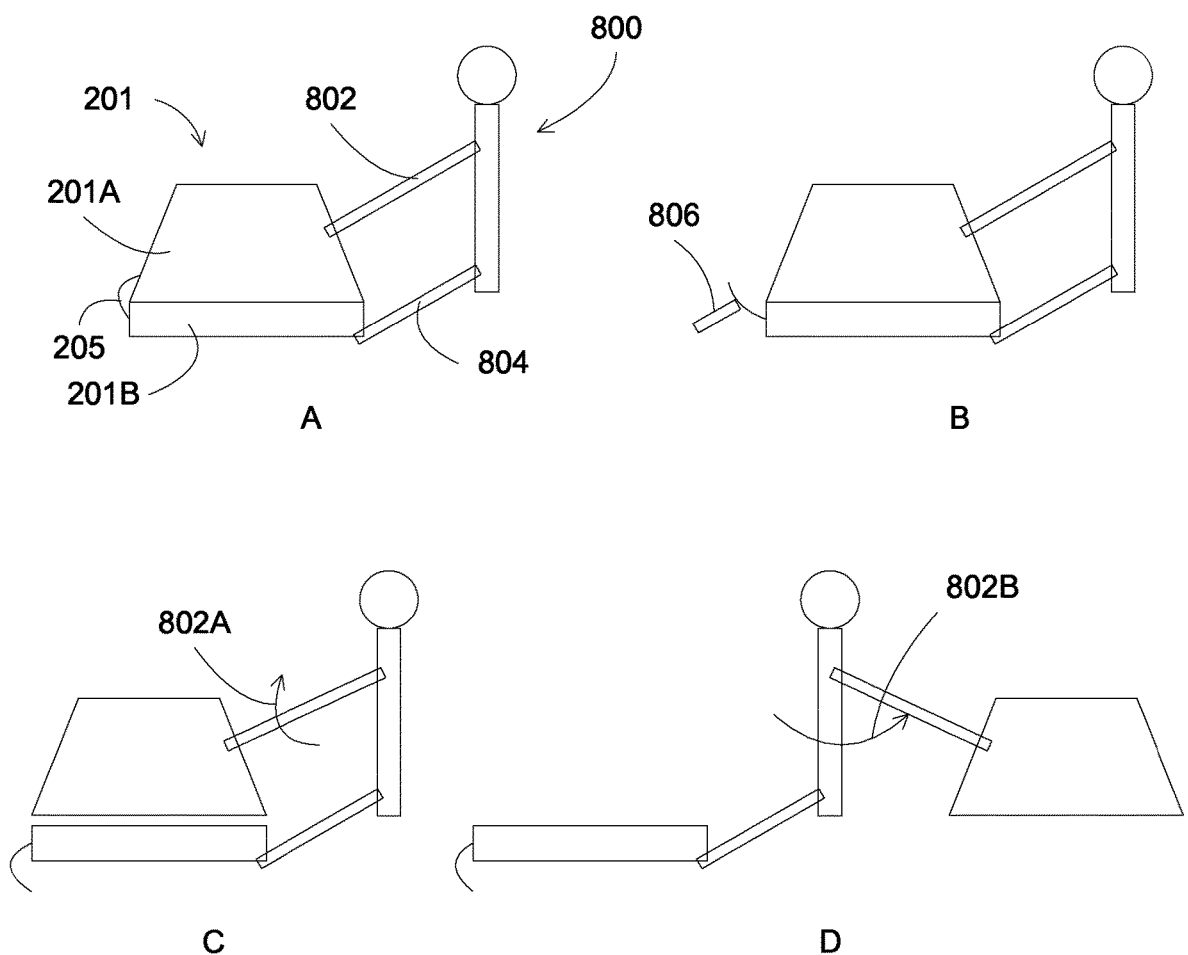
FIG. 19 illustrate another exemplary sequence of an exemplary integrated movement according to embodiments of the present invention.

FIG. 19 illustrate another exemplary sequence of an exemplary integrated movement, together with another robot according to embodiments of the present invention. The robot 800 comprises a first gripper 802 for handling a container body, and a second gripper 804 for handling a container lid. The robot 800 can also perform other actions, such as rotating and moving, to grip and to deposit the container members.

FIG. 19(A) illustrates a robot 800 gripping a container 201, with arm 802 gripping container body 201A and arm 804 gripping container lid 201B. After receiving the container, the robot 800 transfers the container to appropriate locations, such as locations in a cleaning station. During the transfer, additional action can be performed, such as locking/unlocking and assembling/separating the container. FIG. 19(B) illustrates an exemplary configuration of unlocking actions, comprising robot 800 passing a locking/unlocking member 806 to unlock (i.e., unfasten) the container, e.g., releasing or unfastening the lock that locks the lid to the body. The robot can stop at the locking/unlocking member 806 long enough for the member 806 to unlock the lock, or the robot can pass through the member 806, with the passing action unlocking the lock. After unlocking the lock and performing a separating action to separate the lid from the body (FIG. 19(C)), the robot moves, sequentially or parallely, to the appropriate locations for depositing the lid and the body (FIG. 19(D)).

To retrieve the container after cleaning, the sequence can be performed in reverse, for example, picking the lid and the body sequentially, and assembling/locking during transfer to a load port.

Figure 20:
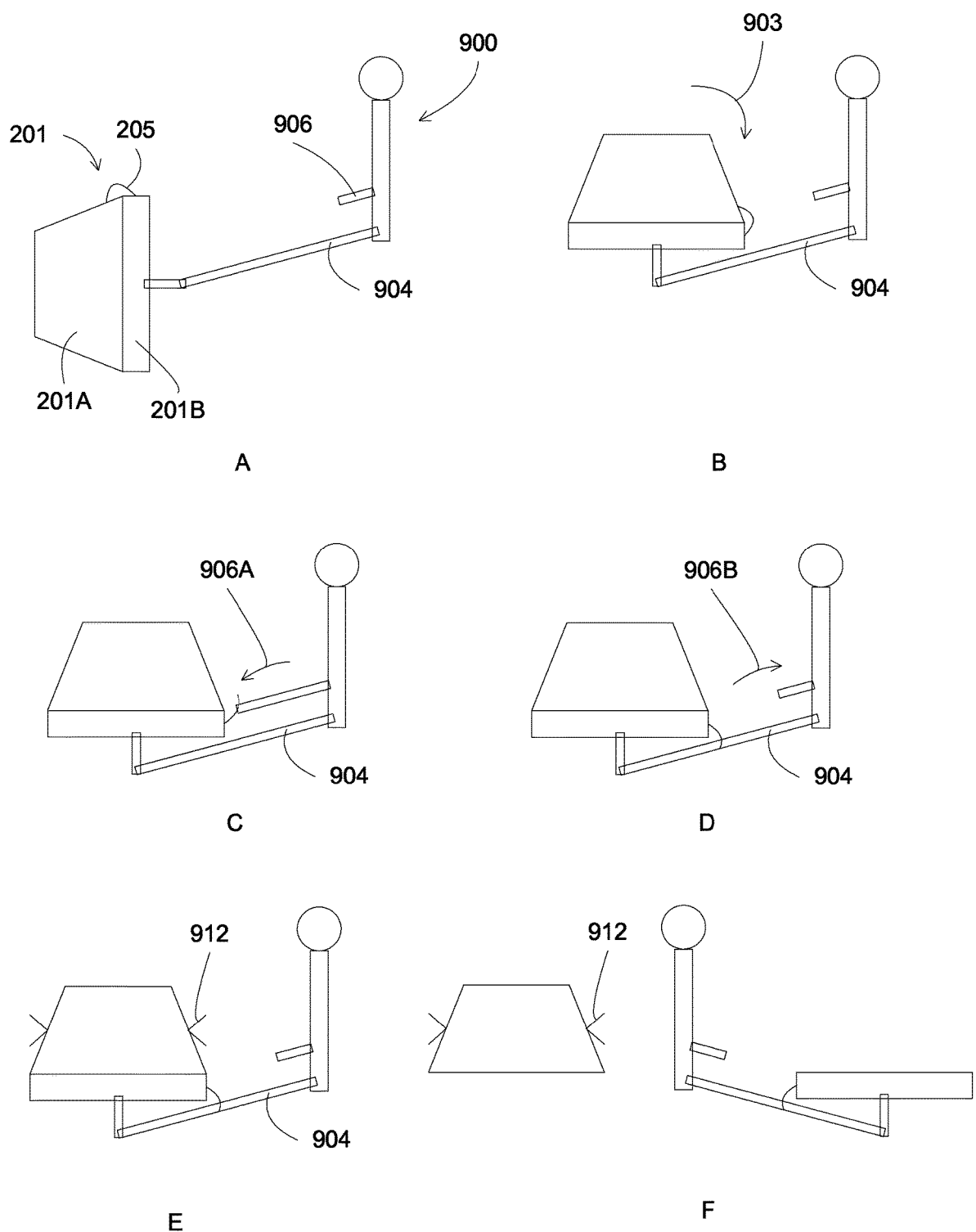
FIG. 20 illustrate another exemplary sequence of an exemplary integrated movement according to embodiments of the present invention.

FIG. 20 illustrate another exemplary sequence of an exemplary integrated movement, together with another robot according to embodiments of the present invention. The robot 900 comprises a gripper 904 for handling a container, and a locking/unlocking member 906 for locking and unlocking the lock of the container. The robot 900 can also perform other actions, such as rotating and moving, to grip and to deposit the container members. The robot 900 shows an exemplary configuration of arm 904 handling lid 201B, but other configurations are within the scope of the present invention, for example, an arm handling a body or other member of the container, or a single arm designed to handle multiple members of the container, such as through the locking mechanism or through additional actuations.

FIG. 20(A) illustrates arm 904 gripping lid 201B, for example, from a load port, and then transferring the whole container to a cleaning station where members of the container are deposited in appropriate locations. Even though the arm 904 only grips the lid, the whole container also moves since the body and the lid are connected through a locking mechanism 205. During the container receipt action, the locking/unlocking member 906 is refracted at a standby position.

During the transfer of the container to the cleaning station, additional movements are preformed, such as orienting, locking/unlocking and assembling/separating the container. FIG. 20(B) illustrates an orienting action 903 where the robot arm orients the container to a configuration where the body is on top of the lid. In this orientation, the body is supported by the lid by weight even if the lock mechanism 205 between the lid and the body is released. The orientation is designed so that the arm 904 can support all members of the container, even though arm 904 grips only one member of the container.

After the container is oriented in appropriate orientation, the locking/unlocking member 906 is engaged 906A to unlock the lock 205 (FIG. 20(C)), and dis-engaged 906B after the lock is released (FIG. 20(D)). Alternatively, the locking/unlocking member can be positioned in the cleaner where the robot can pass by to unlock the lock 205. The orienting and unlocking actions occur during the transfer of the container from the load port to the cleaning station.

The robot continues movement to transfer the container, reaching the location to deposit the body. With the lock released, the robot keeps the container properly oriented to prevent the members of the container from being separated. The body is then deposited to its location, for example, by support members 912 located in the cleaning station (FIG. 20(E)). Alternatively, the robot includes an actuator (not shown) to move the body to the location. The robot continues to move to the cleaning location of the lid to deposit the lid (FIG. 20(F)). The body and lid deposition can alternatively performed in parallel. Container retrieval movements can be performed in reverse.

In an embodiment, the present invention discloses a system incorporating a robot for performing integrated movements, such as a cleaner system for cleaning containers. In other embodiments, the present invention discloses methods for integrated movements of container transfer, comprising transferring all members of a container at a same time, and unlocking/locking and assembling/separating the members of a container during whole container transfer.

In an embodiment, the present apparatus for transferring articles comprising multiple portions comprises a transferring mechanism for holding an article and for transferring the article between a first station and a second station, wherein the transferring mechanism accepts the article from the first station or delivers the article to the first station; a portion transfer mechanism for transferring individual portions of the article to or from separate locations of the second station, wherein the apparatus detaches the multiple portions during transferring from the first station to the second station or attaches the multiple portions during transfer from the second station to the first station. The apparatus can further comprise an access mechanism for locking or unlocking the multiple portions of the article.

In an embodiment, the present invention discloses a cleaner system for cleaning containers, each container comprising at least a container body and a container lid. The system comprises one or more load ports for holding a container; a cleaning chamber for cleaning the container in separated configuration, wherein the container body and lid are detached and disposed in separate locations in the cleaning chamber; a transfer mechanism for transfer the container between a load port of the one or more load ports and the cleaning chamber, wherein the transfer mechanism transfers the container with the body and lid in assembled configuration at the load ports and transfers the container with the body and lid in disassembled and separated configuration at the cleaning chamber, and wherein the transfer mechanism assembles or disassembles the body and the lid on-the-fly during transferring. In an embodiment, the transfer mechanism comprises one of a locking mechanism for locking the body and lid together and an unlocking mechanism for unlocking the body and lid. The transfer mechanism can comprise a portion transfer mechanism for sequentially or parallely delivering the body and the lid into separate locations in the cleaning chamber. The transfer mechanism can comprise a portion transfer mechanism for sequentially or parallely accepting the body and the lid from separate locations in the cleaning chamber.

Figure 21:
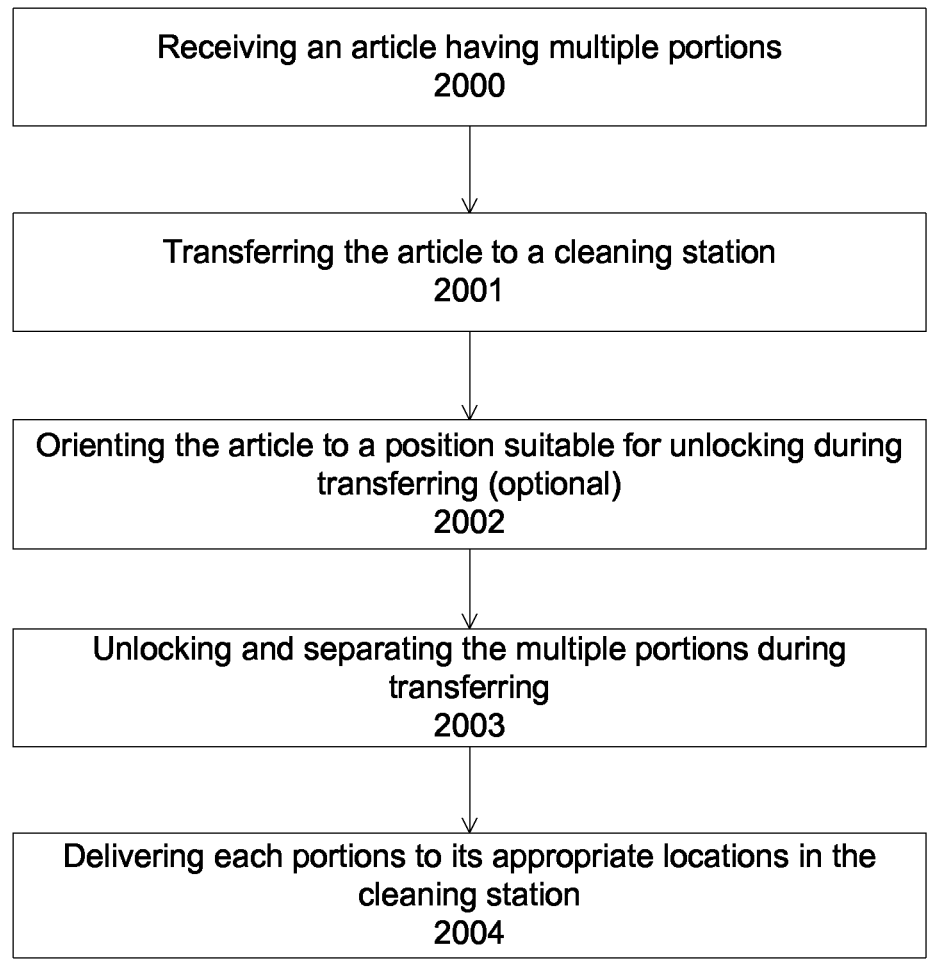
FIG. 21 illustrates an exemplary flow chart for transferring a container from a load port to a cleaning station.

FIG. 21 illustrates an exemplary flow chart for loading an article having multiple portions from a load port to a cleaning station, such as a container having a body and a lid. In operation 2000, a robot receives a container from a load port. The container can be locked with the lid engaged to the body. Alternatively, the container can be assembled but not locked, or the container can have the body and the lid separated. In an embodiment, the robot receives the container in a way as to be able to support the multiple portions of the container. For example, if the body and lid are locked together, the container can be supported by holding to any part of the container, since the body and lid are attached to each other. If the body and lid are assembled together but not locked, then care should be taken to ensure both portions are held. For example, a robot gripper can push both portions together to hold the container. If the two portions are on top of each other, then holding the bottom portion can support both portions. If the body and lid are separate, then they can be assembled together before handling by the robot. Alternatively, the robot might receive the separate portions before transferring.

After receiving the container, operation 2001 transfers the container to a process station, such as a cleaning station. During transfer, operation 2002 optionally orients the container to a suitable position for disassembling, for example, for unlocking and for separating the lid from the body. For example, the container is oriented so that the body and lid are on top of each other, such that gravity helps to support the top piece through the bottom piece. This operation is optional, and needed if the container is received in a manner that unlocking the portions might affect the stability of the whole container.

Also, during transfer, the multiple portions are unlocked and separated in operation 2003. Variations of this operation can be performed, depending on the status of the received container. For example, if the container is already unlocked when received by the robot, then the unlocking mechanism is not necessary. If the container is already unlocked and separated, then the whole operation might not be needed.

After unlock and separation during transfer, the multiple portions of the container are delivered to the appropriate location in the cleaning station in operation 2004. The timing can be calculated so that the orientating, unlocking and separating of the multiple portions are completed during the transfer, so that when the pieces reach their destination, the multiple portions are ready to be delivered.

Unloading operation from cleaning station to a load port is reverse, with multiple portions received sequentially, and assembled and locked during transport to the output load port.

Figure 22:
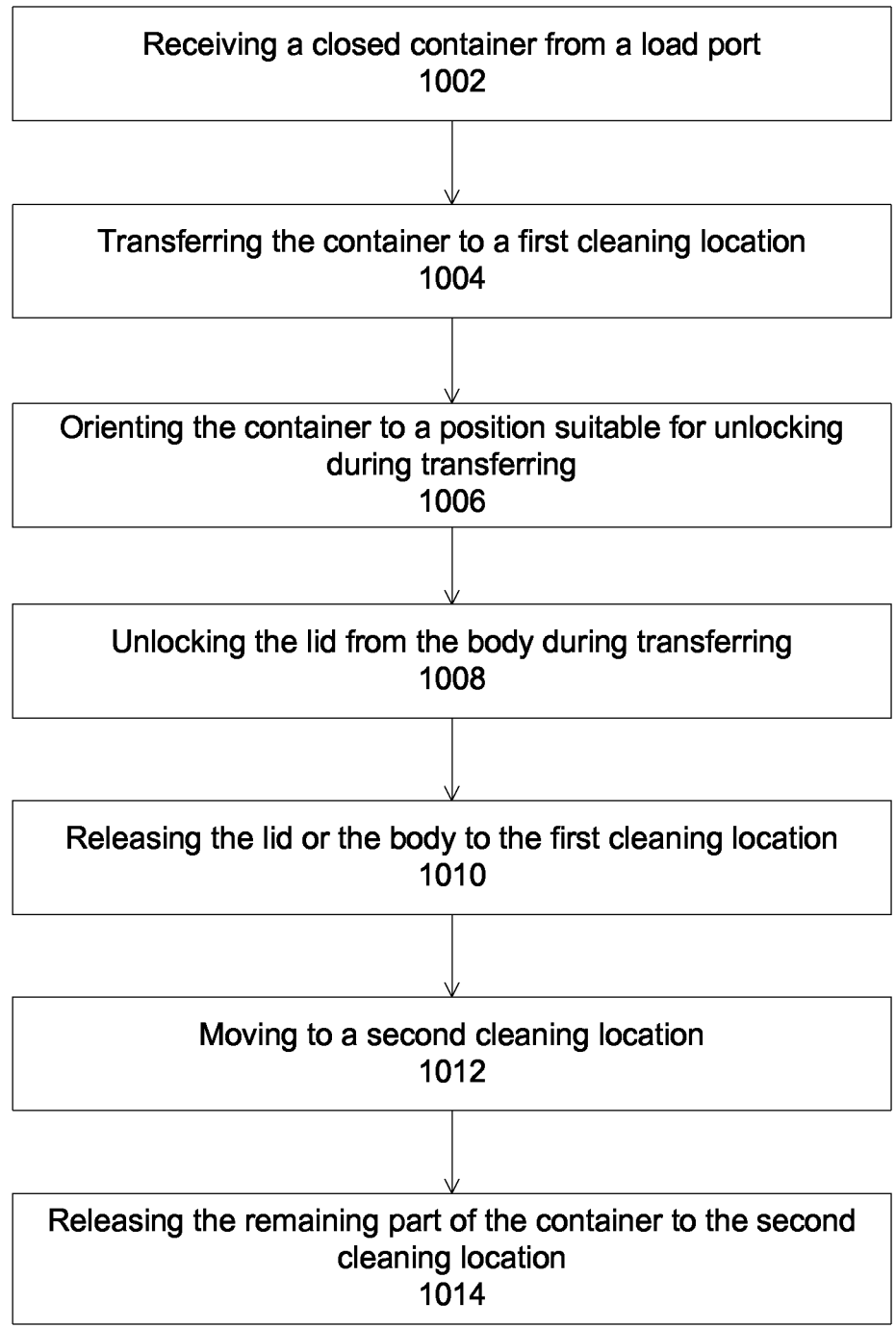
FIG. 22 illustrates a flow chart for transferring a container from a load port to a cleaning station according to an embodiment of the present invention.

FIG. 22 illustrates a flow chart for transferring a container from a load port to a cleaning station. In operation 1002, a robot receives a closed container from a load port. For a cleaning operation, the container is empty with a locking mechanism engaged for locking the lid and the body together. The container can be placed in the load port manually or automatically, for example, from an automatic transport. In operation 1004, the robot transfers the container as a whole to destination locations, for example, a cleaning station. For separate cleaning locations for members of the container, the robot can move sequentially from one location to another. For example, the robot can first move to the body cleaning location, and then move to the lid cleaning location after placing the body at its cleaning location. In operation 1006, the robot orients the container to a position suitable for unlocking the locking mechanism during the transfer. This is an optional operation, allowing the members of the container to be supported by a single gripper arm gripping one member of the container. In operation 1008, also during the transfer, an unlocking member unlocks the locking mechanism to disengage the lid from the body of the container. The unlocking member can be an integral part of the robot, allowing the unlocking action to be performed during the movement of the robot. After unlocking, the members of the container are kept together by weight, and further robot movements are designed for keeping the members of the container together. In operation 1010, after reaching a first cleaning location, for example, the cleaning location for the body, the robot places the body (or the lid) in the appropriate cleaning location. In operation 1012, after releasing the body (or the lid) in the cleaning location, the robot moves to a second cleaning location. In operation 1014, the robot places the remaining part of the container, for example, the lid, in the second cleaning location.

Figure 23:
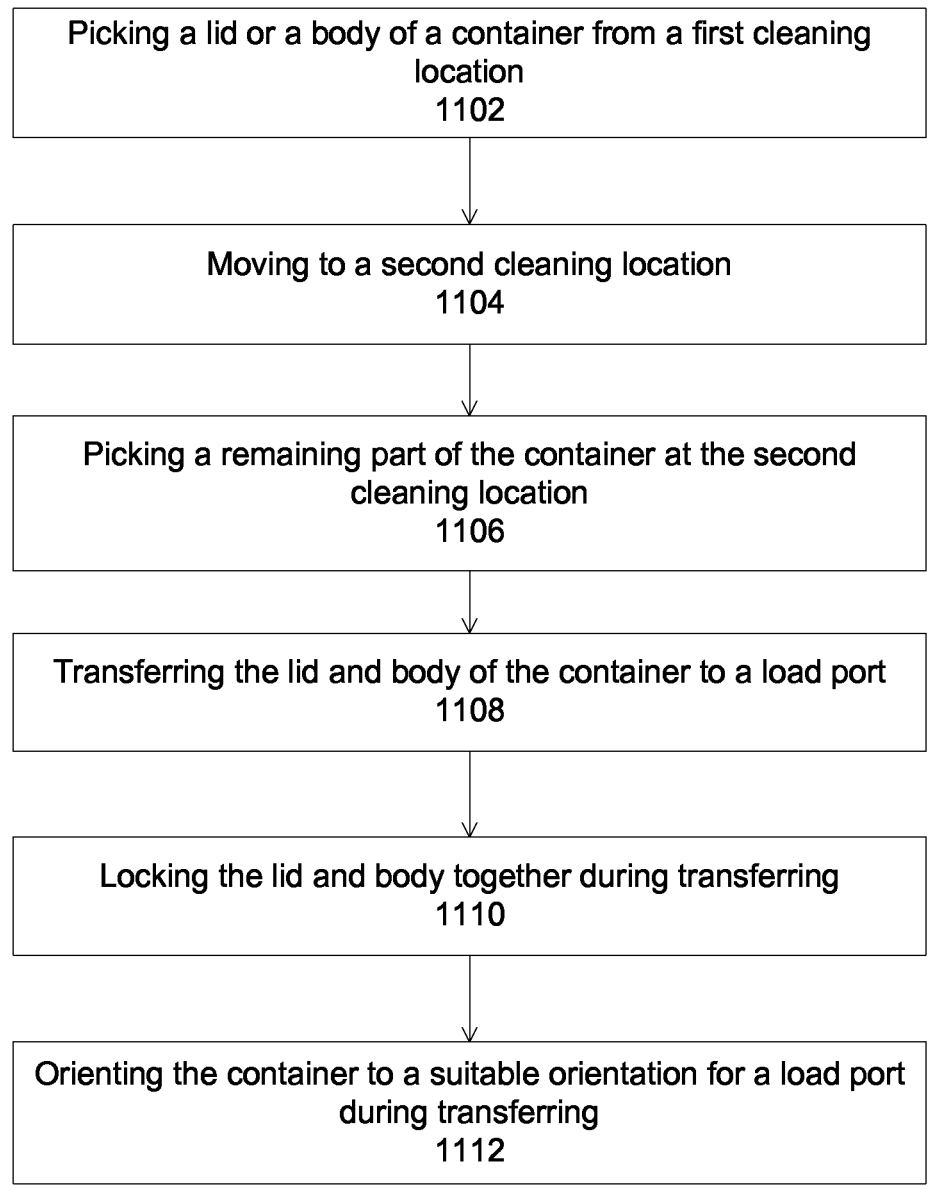
FIG. 23 illustrates a flow chart for transferring a container from a cleaning station to a load port according to an embodiment of the present invention.

FIG. 23 illustrates a flow chart for transferring a container from a cleaning station to a load port. In operation 1102, a robot picks up a member of the container, for example, a lid of a body, from a first cleaning location. In operation 1104, the robot moves to a second cleaning location. In operation 1106, the robot picks up the remaining member of the container, for example, a body or a lid, at the second cleaning location. In operation 1106, the robot transfers the lid and the body to a load port. In operation 1110, during the transfer, the lid and the body are engaged and locked together, for example, by a locking member located on the robot. In operation 1112, during transfer, the robot positions the locked container in an orientation suitable for load port placement.

In an embodiment, the present invention discloses methods for transferring semiconductor articles, using an integrated transfer mechanism. The present invention discloses a method for transferring an article comprising multiple portions comprising transferring an article with the multiple portions in assembled configuration between a first station and a transfer mechanism; moving the article, by the transfer mechanism, between the first station and a second station; and transferring the multiple portions of the article between a second station and the transfer mechanism, wherein the multiple portions are disposed in separate locations in the second station. In an embodiment, the article is a container comprising a body portion and a lid portion. Transferring an article with the multiple portions in assembled configuration between a first station and a transfer mechanism can comprise accepting an article having multiple portions locked together from the first station to the transfer mechanism. Transferring an article with the multiple portions in assembled configuration between a first station and a transfer mechanism can comprise delivering an article having multiple portions locked together from the transfer mechanism to the first station. Transferring the multiple portions of the article between a second station and the transfer mechanism can comprise sequentially delivering multiple portions from the transfer mechanism to their appropriate locations in the second station. Transferring the multiple portions of the article between a second station and the transfer mechanism can comprise parallely delivering multiple portions from the transfer mechanism to their appropriate locations in the second station. Transferring the multiple portions of the article between a second station and the transfer mechanism can comprise sequentially accepting multiple portions from their appropriate locations in the second station to the transfer mechanism. Transferring the multiple portions of the article between a second station and the transfer mechanism can comprise parallely accepting multiple portions from their appropriate locations in the second station to the transfer mechanism. In an embodiment, the method further comprises unlocking the multiple portions during moving the article; locking the multiple portions during moving the article; disassembling the multiple portions during moving the article; assembling the multiple portions during moving the article; cleaning the multiple portions in the second station; sequentially cleaning and vacuum drying the multiple portions in the second station.

The present invention may be embodied in other specific forms without departing from the spirit or essential attributes thereof, and it is therefore desired that the present embodi-

What is claimed is:

1. A method for transferring an article having multiple portions, the method comprising:
   moving the article, by a transfer mechanism, directly between a first station and a second station, wherein the multiple portions of the article are in an assembled configuration at the first station; and
   passing the article, supported on the transfer mechanism, past a member during the movement of the transfer mechanism, with the article supported thereon, from the first station to the second station through the member, wherein the member disassembles the multiple portions of the article supported on the transfer mechanism coincident with the passing of the transfer mechanism through the member, such that the member disassembles the multiple portions of the article on-the-fly during the article passing past the member;
   wherein the multiple portions are disposed in separate locations in the second station.

2. The method of claim 1, wherein the article is a container comprising a body portion and a lid portion.

3. The method of claim 1, wherein moving the article with the multiple portions in assembled configuration between the first station and the second station comprises accepting the article having multiple portions locked together from the first station by the transfer mechanism.

4. The method of claim 1, wherein moving the article with the multiple portions in assembled configuration between the first station and the second station comprises delivering the article having multiple portions locked together by the transfer mechanism to the first station.

5. The method of claim 1, wherein the member unlocks the multiple portions during moving the article from the first station to the second station.

6. The method of claim 1, further comprising cleaning the multiple portions in the second station.

7. The method of claim 1, further comprising sequentially cleaning and vacuum drying the multiple portions in the second station.

8. The method of claim 1, wherein the first station comprises a load lock.

9. The method of claim 1, wherein the second station comprises a cleaning station.

10. The method of claim 1, wherein passing action of the article past the member unlocks the article.

11. The method of claim 1, wherein the member unlocks the article when the article passes past the member.

12. The method of claim 1, further comprising unlocking the article during the passing of the article past the member.

13. A method for transferring an article having multiple portions, the method comprising:
   accepting the article at a first station by a transfer mechanism;
   wherein the multiple portions of the article are locked together at the first station;
   moving the article, supported by the transfer mechanism, from the first station to a second station;
   unlocking, with the transfer mechanism, the multiple portions of the article supported by the transfer mechanism coincident with the movement of the transfer mechanism, with the article supported thereon, from the first station to the second station, such that the transfer mechanism disassembles the multiple portions of the article on-the-fly during the article moving from the first station to a second station;
   wherein the multiple portions are disposed in separate locations in the second station.

14. The method of claim 13, wherein the first station comprises a load lock.

15. The method of claim 13, further comprising cleaning the multiple portions in the second station.

16. The method of claim 13, wherein the transfer mechanism passes the article past a member during the movement of the transfer mechanism, with the article supported thereon, from the first station to the second station through the member, wherein the member is configured to unlock the article when the article passes past the member.

17. The method of claim 13, further comprising passing the article past a member during the movement of the transfer mechanism, with the article supported thereon, from the first station to the second station through the member, wherein the member is configured to unlock the article when the article passes past the member.

18. A method for transferring an article having multiple portions, the method comprising:
   accepting the article at a first station by a transfer mechanism;
   wherein the multiple portions of the article are locked together at the first station;
   moving the article, supported by the transfer mechanism, from the first station to a second station;
   wherein moving the article from the first station to a second station comprises stopping movement of the article, supported on the transfer mechanism, with the transfer mechanism during the movement from the first station to the second station;
   wherein the article is stopped at a member for the member to unlock a lock that locks the multiple portions of the article supported by the transfer mechanism coincident with the article moving from the first station to the second station;
   wherein the multiple portions are disposed in separate locations in the second station.

19. The method of claim 18, wherein the first station comprises a load lock.

20. The method of claim 18, further comprising cleaning the multiple portions in the second station.

* * * * *